US011152368B2

(12) United States Patent
Choi et al.

(10) Patent No.: US 11,152,368 B2
(45) Date of Patent: Oct. 19, 2021

(54) SEMICONDUCTOR DEVICE INCLUDING STORAGE NODE ELECTRODE HAVING FILLER AND METHOD FOR MANUFACTURING THE SAME

(71) Applicant: SAMSUNG ELECTRONICS CO., LTD., Suwon-si (KR)

(72) Inventors: Yoonyoung Choi, Seoul (KR); Byunghyun Lee, Hwaseong-si (KR); Seungjin Kim, Hwaseong-si (KR); Byeongjoo Ku, Incheon (KR); Sangjae Park, Seoul (KR); Hangeol Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/908,833

(22) Filed: Jun. 23, 2020

(65) Prior Publication Data

US 2021/0151439 A1    May 20, 2021

(30) Foreign Application Priority Data

Nov. 19, 2019  (KR) .................. 10-2019-0149036

(51) Int. Cl.
*H01L 27/108* (2006.01)
*H01L 21/768* (2006.01)
*H01L 23/532* (2006.01)

(52) U.S. Cl.
CPC .... *H01L 27/10814* (2013.01); *H01L 21/7682* (2013.01); *H01L 23/5329* (2013.01); *H01L 27/10855* (2013.01); *H01L 27/10888* (2013.01)

(58) Field of Classification Search
CPC ......... H01L 27/10814; H01L 27/10855; H01L 21/7682; H01L 23/5329; H01L 27/10888
See application file for complete search history.

(56) References Cited

U.S. PATENT DOCUMENTS

| 7,727,837 | B2 | 6/2010 | Gruening-Von Schwerin et al. |
|---|---|---|---|
| 8,288,224 | B2 | 10/2012 | Huang et al. |
| 9,159,729 | B2 | 10/2015 | Kim et al. |
| 9,293,336 | B2 | 3/2016 | Yang et al. |
| 9,673,272 | B2 | 6/2017 | Choi et al. |
| 10,121,793 | B2 | 11/2018 | Kim et al. |
| 2011/0306208 | A1 | 12/2011 | Lee et al. |
| 2013/0270672 | A1* | 10/2013 | Lim ........................ H01L 28/60 257/532 |
| 2018/0301459 | A1* | 10/2018 | Kim ...................... B08B 7/0014 |
| 2021/0134942 | A1* | 5/2021 | Kim ........................ H01L 28/60 |

FOREIGN PATENT DOCUMENTS

| KR | 10-0550347 | 2/2006 |
|---|---|---|
| KR | 10-2006-0064273 | 6/2006 |
| KR | 10-2009-0116062 | 11/2009 |
| KR | 10-1090369 | 12/2011 |

* cited by examiner

*Primary Examiner* — John P. Dulka
(74) *Attorney, Agent, or Firm* — F. Chau & Associates, LLC

(57) ABSTRACT

A semiconductor device includes a substrate, a storage node electrode disposed on the substrate, a dielectric layer at least partially covering the storage node electrode, and a plate electrode dispose on the dielectric layer. The storage node electrode has a pillar shape, and includes a seam disposed therein. The storage node electrode includes a concave side surface disposed at a higher level than the seam.

20 Claims, 36 Drawing Sheets

SEMICONDUCTOR DEVICE INCLUDING STORAGE NODE ELECTRODE HAVING FILLER AND METHOD FOR MANUFACTURING THE SAME

CROSS-REFERENCE TO RELATED APPLICATION

This application claims the benefit of Korean Patent Application No. 10-2019-0149036, filed in the Korean Intellectual Property Office on Nov. 19, 2019, the disclosure of which is incorporated herein by reference.

TECHNICAL FIELD

The present disclosure relates to a semiconductor device and, more particularly, to a semiconductor device including a storage node electrode having a filler and a method for manufacturing the same.

DISCUSSION OF THE RELATED ART

As semiconductor devices become smaller and more highly integrated, capacitors in dynamic random access memory (DRAM) devices tend to be greatly increased in aspect ratio to provide a high capacity within a limited area. Furthermore, the spacing between lower electrodes of such a capacitor may be very small. For this reason, the lower electrodes may fall or may be otherwise broken during fabrication processes. Furthermore, a bridge phenomenon may occur between adjacent lower electrodes. In addition, current leakage may occur.

SUMMARY

A semiconductor device includes a substrate. A storage node electrode is disposed on the substrate. A dielectric layer at least partially covers the storage node electrode. A plate electrode is disposed on the dielectric layer. The storage node electrode has a pillar shape, and includes a seam disposed therein. The storage node electrode further includes a concave side surface disposed at a higher level than the seam.

A semiconductor device includes a substrate. A storage node electrode is disposed on the substrate. A dielectric layer at least partially covers the storage node electrode. A plate electrode is disposed on the dielectric layer. A supporter pattern is disposed on a side surface of the storage node electrode. The supporter pattern includes a lower supporter pattern disposed on the substrate and an upper supporter pattern disposed on the lower supporter pattern. The upper supporter pattern has a convex side surface. The storage node electrode includes a concave side surface disposed at an upper portion of the storage node electrode. The concave side surface contacts the convex side surface of the upper supporter pattern.

A method for manufacturing a semiconductor device includes forming an element isolation layer in a substrate to define a source/drain region. A word line extending in a first direction across the source/drain regions is formed in the substrate. A bit line contact plug is formed on the source/drain region. A bit line extending in a second direction is formed on the bit line contact plug. A storage node is formed contact on the source/drain region. A landing pad is formed on the storage node contact. A storage node electrode is formed on the landing pad. A dielectric layer is formed surrounding a surface of the storage node electrode. A plate electrode is formed on the dielectric layer. A supporter pattern is formed contacting a side surface of the storage node electrode. The storage node electrode has a pillar shape having a seam disposed therein and has a concave side surface at an upper portion thereof. The supporter pattern includes an overhang contacting the side surface of the upper portion of the storage node electrode while vertically overlapping with the storage node electrode.

BRIEF DESCRIPTION OF THE DRAWINGS

The above and other objects, features and other aspects of the present disclosure will be more clearly understood from the following detailed description taken in conjunction with the accompanying drawings, in which.

DETAILED DESCRIPTION OF THE PREFERRED EMBODIMENTS

Reference will now be made in detail to the preferred embodiments of the present disclosure, examples of which are illustrated in the accompanying drawings. The same reference numbers may be used throughout the drawings and specification to refer to the same or like parts.

Figure 1A:
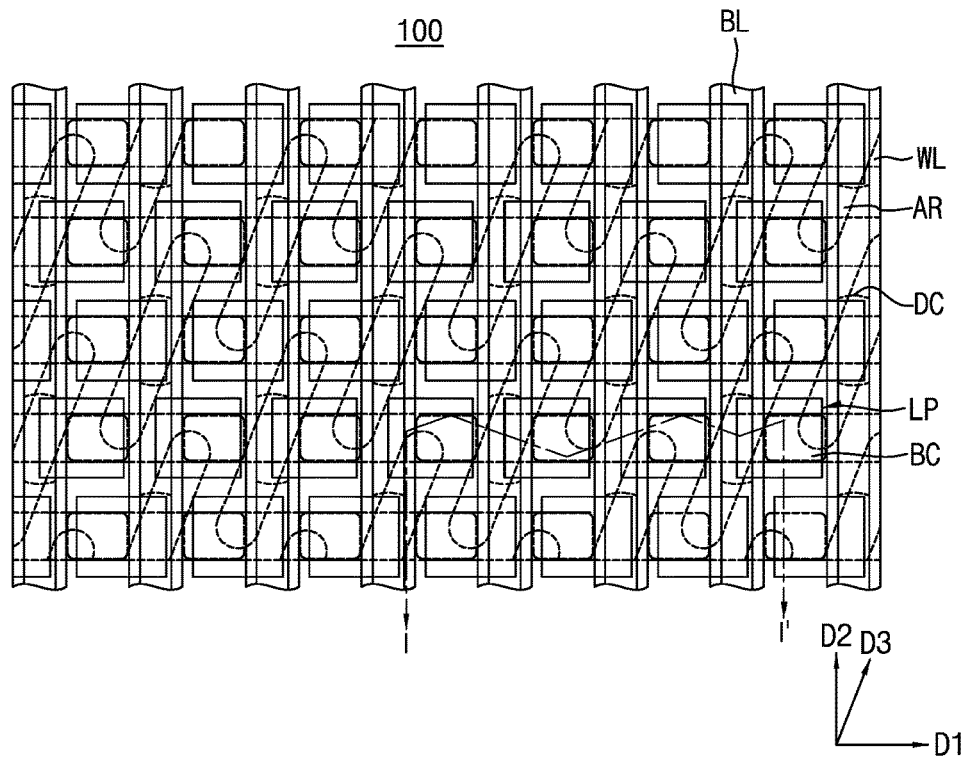
FIG. 1A is a layout view schematically illustrating a semiconductor device according to an embodiment of the present disclosure.
Figure 1B:
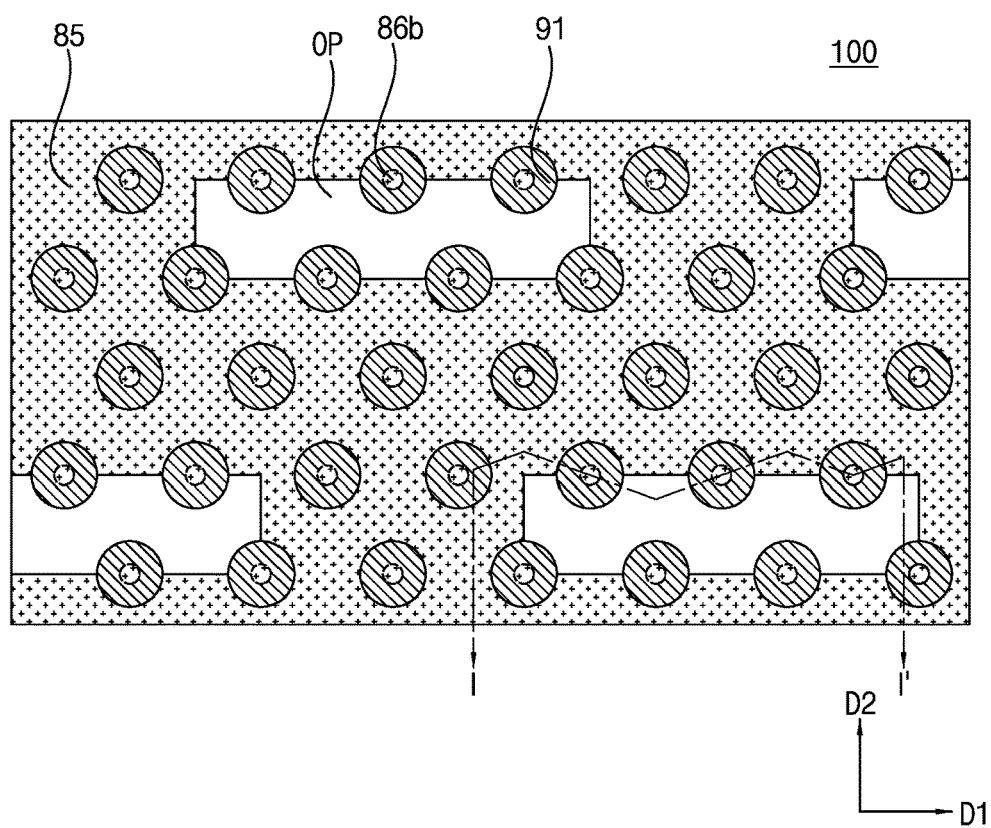
FIG. 1B is a plan view showing an upper supporter pattern and storage node electrodes of the semiconductor device according to an embodiment of the present disclosure.
Figure 1C:
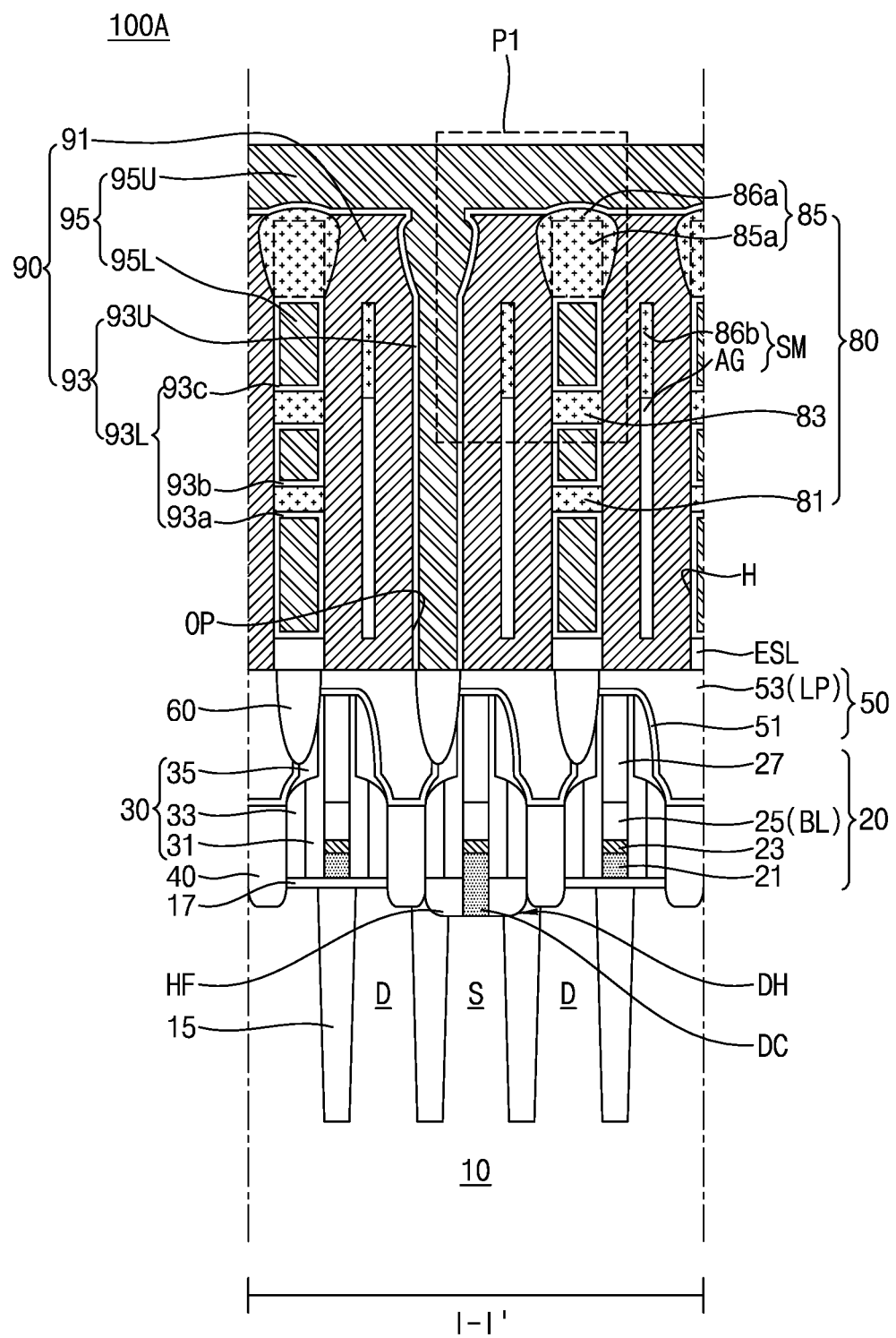
FIG. 1C is a cross-sectional view taken along line I-I in FIGS. 1A and 1B schematically illustrating a semiconductor device according to an embodiment of the present disclosure.

FIG. 1A is a layout view schematically illustrating a semiconductor device 100 according to an embodiment of the present disclosure. FIG. 1B is a plan view illustrating an upper supporter pattern 85 and storage node electrodes 91 of the semiconductor device 100 according to the embodiment of the present disclosure. FIG. 1C is a cross-sectional view taken along line I-I in FIGS. 1A and 1B schematically illustrating a semiconductor device 100A according to an embodiment of the present disclosure.

Referring to FIG. 1A, the semiconductor device 100 may include word lines WL extending in primarily in a first direction D1, active regions AR each having a bar-shaped island structure extending primarily in a third direction D3, and bit lines BL extending primarily in a second direction D2. The semiconductor device 100 may further include bit line node contacts DC each overlapping with corresponding ones of the active regions AR and the bit lines BL, storage node contacts BC each disposed between corresponding ones of the word lines WL and between corresponding ones of the bit lines BL, and landing pads LP each overlapping with opposite ends of adjacent ones of the active regions AR.

The first direction D1 may be a row direction, for example, an X-direction. The second direction D2 may be a column direction, for example, a Y-direction. The third direction D3 may be a direction diagonal to the first direction D1 and the second direction D2. For example, the third direction may be a direction between the first direction D1 and the second direction D2, with all three of these directions D1, D2, and D3 sharing a common plane. The first direction D1 and the second direction D2 may be perpendicular to each other. The center of each active region AR may be adjacent to an end of another active area AR. The word lines WL may divide each of corresponding ones of the active regions AR into three portions. Each bit line BL may extend through centers of corresponding ones of the active regions AR.

Referring to FIGS. 1A, 1B, and 1C, the semiconductor device 100A may further include a substrate 10, element isolation layers 15, bit line structures 20, spacers 30, storage node contacts 40, landing pad structures 50, pad-isolation insulating layers 60, supporter patterns 80, and capacitor structures 90. The semiconductor device 100A may further include interlayer insulating layers 17, contact hole fillers HF, and etch stop layers ESL. Each supporter pattern 80 may include a lower supporter pattern 81, an intermediate supporter pattern 83, and an upper supporter pattern 85.

The element isolation layers 15 may be disposed within the substrate 10 to define the active regions AR. The active regions AR may include source regions S and drain regions D. For example, each active region AR may include one source region S and two drain regions D.

The interlayer insulating layers 17 may be disposed on the substrate 10. The interlayer insulating layers 17 may have a structure in which a plurality of holes is formed at an insulating layer at least partially covering the active regions AR and the element isolation layers 15. Alternatively, the interlayer insulating layers 17 may have island structures spaced apart from one another on a plane. Each interlayer insulating layer 17 may simultaneously cover ends of two adjacent ones of the active regions AR. Each interlayer insulating layer 17 may include at least one of silicon oxide, silicon nitride, other various insulating materials, or combinations thereof.

Each bit line node contact DC may be disposed in a bit line node contact hole DH formed at the substrate 10 and a portion of the element isolation layer 15 while extending between adjacent ones of the interlayer insulating layer 17. A lower surface of each bit line node contact hole DH (or each bit line node contact DC) may be lower than an upper surface of the substrate 10. The width of each bit line node contact hole DH in the second direction D2 may be greater than the width of each bit line node contact DC in the second direction D2. Each bit line node contact DC may contact the corresponding source region S. Each bit line node contact DC may be made of a conductive material. For example, each bit line node contact DC may include at least one film selected from the group including a metal silicide film, a polysilicon film, a metal nitride film, and a metal film.

Two contact hole fillers HF may be disposed at opposite side walls of each bit line node contact DC, respectively. The contact hole fillers HF may at least partially fill the bit line node contact hole DH. In an embodiment, upper surfaces of the contact hole fillers HF and the interlayer insulating layers 17 may be coplanar. For example, the contact hole fillers HF may include an insulating material such as silicon oxide or silicon nitride.

Each bit line structure 20 may be disposed on the corresponding bit line node contact DC and the corresponding interlayer insulating layer 17. Each bit line structure 20 may include a bit line contact 21, a bit line barrier layer 23, a bit line 25 (BL), and a bit line capping layer 27.

The bit line contact 21 may be connected to the corresponding bit line node contact DC. The bit line node contact DC may be formed as the bit line contact 21 extends into the contact hole DH. The bit line contact 21 may include a conductor such as doped polysilicon. The bit line contact 21 may include the same material as the bit line node contact DC.

The bit line barrier layer 23, the bit line 25 and the bit line capping layer 27 may be sequentially disposed on the bit line contact 21 to overlap vertically. The bit line contact 21, the bit line barrier layer 23 and the bit line 25 (BL) may be electrically connected to the corresponding source region S by the bit line node contact DC. The bit line barrier layer 23 may include barrier metal such as titanium nitride (TiN). The bit line 25 may include metal such as tungsten (W). The bit line capping layer 27 may include silicon nitride and/or silicon oxynitride.

Two spacers 30 may be disposed at opposite side walls of each bit line structure 20. Each spacer 30 may include an inner spacer 31, an outer spacer 33, and a capping spacer 35. The inner spacer 31 and the outer spacer 33 may be disposed on an upper surface of the corresponding interlayer insulating layer 17 or the corresponding contact hole filler HF. The inner spacer 31 may be conformally formed on a corresponding side surface of the bit line structure 20. The outer spacer 33 may be disposed on a side surface of the inner spacer 31 such that the outer spacer 33 may be spaced apart from the bit line structure 20. The inner spacer 31 has a smaller thickness at an upper portion thereof than at a lower portion thereof. The outer spacer 31 may at least partially cover a side surface of the lower portion of the inner spacer 31. The capping spacer 35 may at least partially cover an outer side surface of the upper portion of the inner spacer 31, an upper surface of the lower portion of the inner spacer 31, and an upper surface of the outer spacer 33. For example, each spacer 30 may include an insulating material such as silicon oxide and/or silicon nitride.

Each storage node contact 40 may be disposed between two adjacent ones of the bit line structures 20. The storage node contact 40 may contact outer side walls of the corresponding outer spacers 33. The storage node contact 40 may protrude downwards into the substrate 10 such that the storage node contact 40 may be connected to the corresponding drain regions D. The storage node contact 40 may include polysilicon doped with impurities.

Each landing pad structure 50 may be disposed on the corresponding storage node contact 40. The landing pad structure 50 may include a landing pad barrier layer 51 and a landing pad 53. The landing pad barrier layer 51 may conformally cover an upper surface of the bit line capping layer 27, an upper surface of the storage node contact 40, and an outer surface of the capping spacer 35. For example, the landing pad barrier layer 51 may include barrier metal such as titanium nitride TiN. The landing pad may be disposed in the form of a plug on the landing pad barrier layer 51.

Each pad-isolation insulating layer 60 may be disposed between the landing pads 53 in adjacent ones of the landing pad structures 50 to isolate the landing pads 53 from each other. The pad-isolation insulating layer 60 may protrude downwards toward the corresponding spacer 30 between the landing pads 53. For example, the pad-isolation insulating layer 60 may include at least one material of silicon nitride, silicon oxide, or silicon oxynitride.

Each capacitor structure 90 may be disposed on a corresponding one of the landing pad structures 50 on the substrate 10. The capacitor structure 90 may include a storage node electrode 91, a dielectric layer 93, and a plate electrode 95.

As shown in FIG. 1B, the storage node electrodes 91 of the capacitor structures 90 may be repetitively arranged in the first direction D1 and the second direction D2. The storage node electrodes 91 may have a honeycomb structure in which the storage node electrodes 91 are alternately arranged in adjacent rows thereof or adjacent columns thereof. When the storage node electrodes 91 are alternately arranged in a zigzag manner, the distance between adjacent ones of the storage node electrodes 91 may be constant. In an embodiment, the storage node electrodes 91 may be arranged in row and column directions in the form of a lattice pattern.

The storage node electrode 91 may be electrically connected to the landing pad structure 50. The storage node electrode 91 may directly contact an upper surface of the landing pad 53. The storage node electrode 91 may have a pillar shape. The storage node electrode 91 may include metal or a metal compound. For example, the storage node electrode 91 may include titanium nitride (TiN).

The storage node electrode 91 may include a seam SM disposed therein. The seam SM may include a filler 86b. The seam SM may further include an air gap AG. The storage node electrode 91, which includes the seam SM, may have a shape similar to a cylinder. The air gap AG may be formed beneath a lower end of the filler 86b. The filler 86b may include silicon carbonitride (SiCN) or silicon boronitride (SiBN).

Each dielectric layer 93 may conformally cover a surface of the corresponding storage node electrode 91, a surface of the corresponding lower supporter pattern 81, a surface of the corresponding intermediate supporter pattern 83, a surface of the corresponding upper supporter pattern 85, and a surface of the corresponding etch stop layer ESL.

The dielectric layer 93 may include a lower dielectric layer 93L and an upper dielectric layer 93U. The lower dielectric layer 93L may include a first lower dielectric layer 93a, a second lower dielectric layer 93b, and a third lower dielectric layer 93c. The first lower dielectric layer 93a may at least partially cover an upper surface of the etch stop layer ESL, a lower surface of the lower supporter pattern 81, and a portion of a side surface of the storage node electrode 91. The second lower dielectric layer 93b may at least partially cover an upper surface of the lower supporter pattern 81, a lower surface of the intermediate supporter pattern 83, and a portion of the side surface of the storage node electrode 91. The third lower dielectric layer 93c may at least partially cover an upper surface of the intermediate supporter pattern 83, a lower surface of the upper supporter pattern 85, and a portion of the side surface of the storage node electrode 91.

The upper dielectric layer 93U may be disposed on the storage node electrode 91 and the upper supporter pattern 85. The upper dielectric layer 93U may extend downwards to at least partially cover a side surface of the storage node electrode 91 exposed to an opening OP.

The dielectric layer 93 may include at least one of metal oxide such as hafnium oxide ($Hf_xO_y$), aluminum oxide ($Al_xO_y$), titanium oxide ($Ti_xO_y$), tantalum oxide ($Ta_xO_y$), ruthenium oxide ($Ru_xO_y$), lanthanum oxide ($La_xO_y$) or zirconium oxide ($ZrO_2$), a dielectric material having a perovskite structure such as $SrTiO_3$(STO), (Ba, Sr)$TiO_3$(BST), $BaTiO_3$, PZT or PLZT, silicon oxide or silicon nitride.

The plate electrode 95 may include a lower plate electrode 95L and an upper plate electrode 95U. The lower plate electrode 95L may be disposed at a lower level than the upper supporter pattern 85. The lower plate electrode 95L may at least partially fill a space defined by the first lower dielectric layer 93a, the second lower dielectric layer 93b and the third lower dielectric layer 93c. The upper plate electrode 95U may be disposed on the corresponding upper supporter pattern 85 and the corresponding storage node electrode 91. The upper plate electrode 95U may be formed on the upper dielectric layer 93U. The upper plate electrode 95U may be disposed in the opening OP such that the upper plate electrode 95U may extend lengthwise downwardly between proximate corresponding storage node electrodes 91. The plate electrode 95 may include at least one of a semiconductor material doped with impurities, a metal material, metal nitride or metal silicide. For example, the plate electrode 95 may include high melting point metal such as cobalt (Co), titanium (Ti), nickel (Ni), tungsten (W) or molybdenum (Mo). Here, the phrase "high melting point metal" means any metal having a melting point that is equal to or higher than any of the aforementioned metals. The plate electrode 95 may include at least one metal nitride such as titanium nitride (TiN), titanium aluminum nitride (TiAlN) or tungsten nitride (WN).

The lower supporter pattern 81 may be disposed between the first lower dielectric layer 93a and the second lower dielectric layer 93b. The lower supporter pattern 81 may include at least one of silicon nitride (SiN), silicon oxynitride (SiON) or silicon carbonitride (SiCN).

The intermediate supporter pattern 83 may be disposed between the second lower dielectric layer 93b and the third lower dielectric layer 93c. The intermediate supporter pattern 83 may include at least one of silicon nitride (SiN), silicon oxynitride (SiON) or silicon carbonitride (SiCN).

The upper supporter pattern 85 may be disposed between the third lower dielectric layer 93c and the upper dielectric layer 93U. The upper supporter pattern 85 may be disposed at a higher level than the filler 86b of the storage node electrode 91. The upper supporter pattern 85 may have a round surface. For example, the upper supporter pattern 85 may have a side surface having a round shape convex toward the storage node electrode 91. The upper supporter pattern 85 may include a preliminary upper supporter pattern 85a and a supporter capping layer 86a. The convex round side surface of the upper supporter pattern 85 may contact a side surface of an upper portion of the storage node electrode 91. The upper supporter pattern 85 may include a material exhibiting degraded step coverage. For example, the upper supporter pattern 85 may include silicon carbonitride (SiCN) or silicon boronitride (SiBN).

Side surfaces of the lower supporter pattern 81, the intermediate supporter pattern 83 and the upper supporter pattern 85 may contact a side surface of the storage node electrode 91 and, as such, support the storage node electrode 91.

The lower supporter pattern 81, the intermediate supporter pattern 83 and the upper supporter pattern 85 may have different vertical thicknesses. The vertical thickness of the upper supporter pattern 85 may be greater than the vertical thickness of the lower supporter pattern 81. The vertical thickness of the upper supporter pattern 85 may be greater than the vertical thickness of the intermediate supporter pattern 83.

The lower supporter pattern 81, the intermediate supporter pattern 83, and the upper supporter pattern 85 may include openings OP, respectively. The openings OP may be repetitively and regularly formed at the lower supporter pattern 81, the intermediate supporter pattern 83 and the upper supporter pattern 85, respectively. Each opening OP may have a substantially rectangular shape when viewed at a top side. Each opening OP may be disposed adjacent to 6 storage node electrodes 91. In an embodiment, each opening OP may have a parallelogram, trapezoidal, triangular or circular shape, and may be disposed adjacent to a plurality of storage node electrodes 91.

Figure 1D:
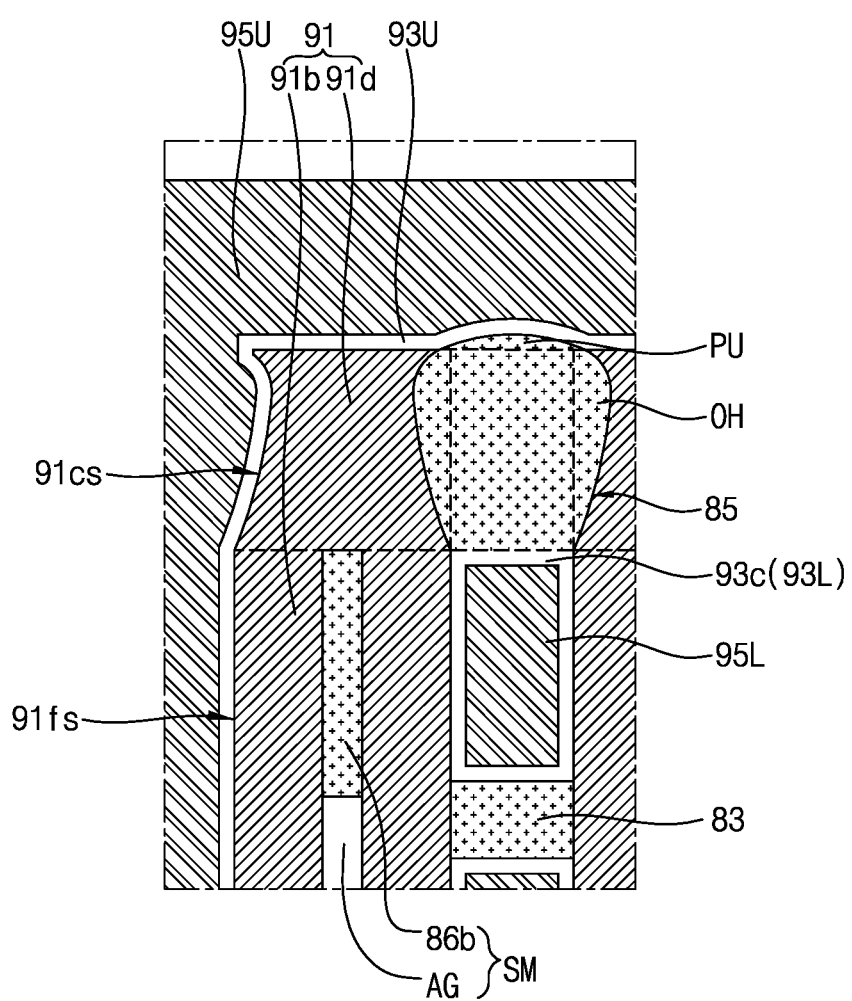
FIG. 1D is an enlarged view of an area P1 in FIG. 1C schematically illustrating the semiconductor device according to an embodiment of the present disclosure.

FIG. 1D is an enlarged view of an area P1 in FIG. 1C to schematically illustrate the semiconductor device 100A according to the embodiment of the present disclosure.

Referring to FIGS. 1C and 1D, each storage node electrode 91 may include a flat side surface 91$fs$ disposed at a lower level than an upper end of the corresponding filler 86$b$, and a concave side surface 91$cs$ disposed at a higher level than the upper end of the filler 86$b$.

The storage node electrode 91 may include a lower storage node electrode 91$b$ and an upper storage node electrode 91$d$. The lower storage node electrode 91$b$ may contact an upper surface of the corresponding landing pad 53 at a lower end thereof. The lower storage node electrode 91$b$ may extend upwardly lengthwise such that an upper end thereof has substantially the same level as a lower end of the corresponding upper supporter pattern 85 (or an upper end of the corresponding third lower dielectric layer 93$c$). The lower storage node electrode 91$b$ may include a seam SM disposed therein. The upper end of the lower storage node electrode 91$b$ may have substantially the same level as an upper end of the corresponding filler 86$b$. The side surface 91$fs$ of the lower storage node electrode 91$b$ may have a flat profile. The lower storage node electrode 91$b$ may have a uniform horizontal width. In an embodiment, the lower storage node electrode 91$b$ may have a width gradually decreasing as the lower storage node electrode 91$b$ extends toward the substrate 10.

The side surface of the lower storage node electrode 91$b$ may contact side surfaces of the lower supporter pattern 81 and the intermediate supporter pattern 83. The side surface of the lower storage node electrode 91$b$ may contact outer side surfaces of the first lower dielectric layer 93$a$, the second lower dielectric layer 93$b$, and the third lower dielectric layer 93$c$.

In an embodiment, the side surface of the lower storage node electrode 91$b$ may contact, at a portion thereof, the outer side surfaces of the first lower dielectric layer 93$a$, the second lower dielectric layer 93$b$ and the third lower dielectric layer 93$c$ while contacting the upper dielectric layer 93U at another portion thereof.

The upper storage node electrode 91$d$ may be disposed on the lower storage node electrode 91$b$. The upper storage node electrode 91$d$ may at least partially cover an upper end of the filler 86$b$ in the lower storage node electrode 91$b$. The side surface 91$cs$ of the upper storage node electrode 91$d$ may have a concave profile. The concave side surface 91$cs$ of the upper storage node electrode 91$d$ may contact the convex round side surface of the corresponding upper supporter pattern 85.

The upper supporter pattern 85 may include an overhang OH vertically overlapping with the storage node electrode 91. The upper supporter pattern 85 may include a protrusion PU protruding upwards, with a convex shape, toward the upper plate electrode 95U. The upper supporter pattern 85 has an upper end disposed at a higher level than an upper end of the storage node electrode 91. The supporter capping layer 86$a$ may include the overhang OH and the protrusion PU.

Figure 2A:
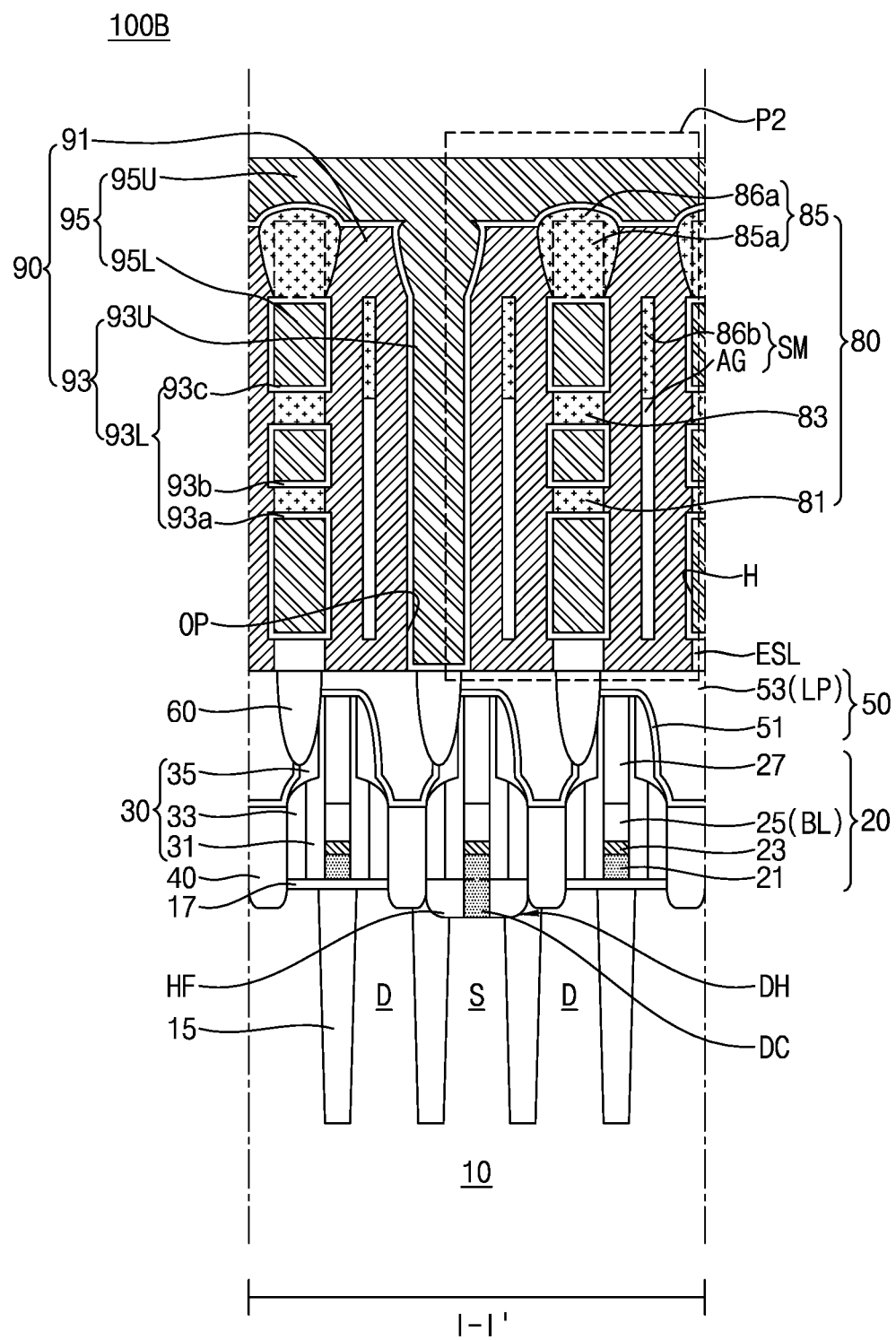
FIG. 2A is a cross-sectional view taken along line I-I' in FIGS. 1A and 1B schematically illustrating a semiconductor device according to an embodiment of the present disclosure.
Figure 2B:
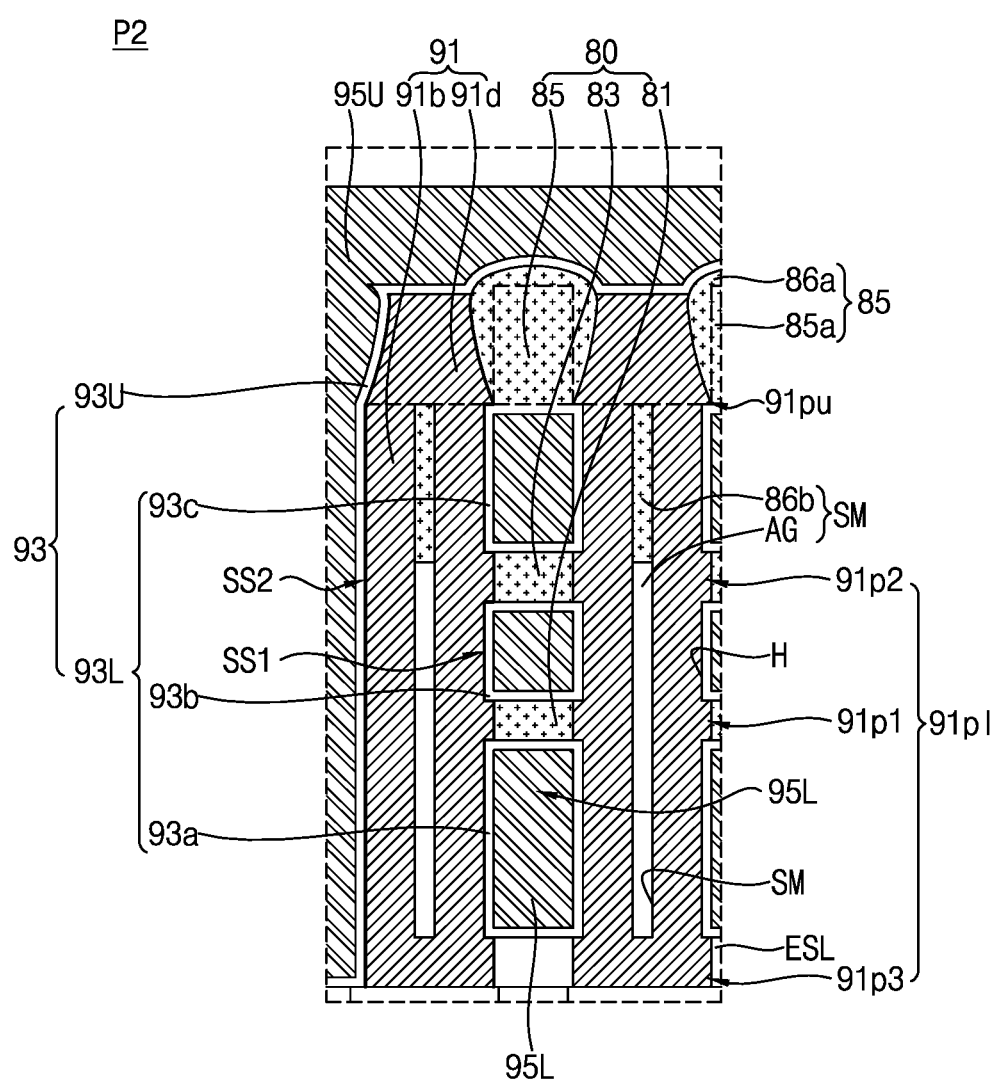
FIG. 2B is an enlarged view of an area P2 schematically illustrating the semiconductor device according to an embodiment of the present disclosure.

FIG. 2A is a cross-sectional view taken along line I-I' in FIGS. 1A and 1B to schematically illustrate a semiconductor device 100B according to an embodiment of the present disclosure. FIG. 2B is an enlarged view of an area P2 to schematically illustrate the semiconductor device 100B according to the embodiment of the present disclosure.

Referring to FIGS. 1A, 1B, 2A and 2B, the lower storage node electrode 91$b$ of the semiconductor device 100B, according to the embodiment of the present disclosure, may include a protrusion 91$p$1 protruding laterally to vertically overlap with the lower dielectric layer 93L. The protrusion 91$p$1 may include a first protrusion 91$p$1 disposed at the same level as the lower supporter pattern 81, a second protrusion 91$p$2 disposed at the same level as the intermediate supporter pattern 83, and a third protrusion 91$p$3 disposed at the same level as the etch stop layer ESL. The first protrusion 91$p$1 may be interposed between the first lower dielectric layer 93$a$ and the second lower dielectric layer 93$b$. The first protrusion 91$p$1 may contact the first lower dielectric layer 93$a$, the second lower dielectric layer 93$b$ and the lower supporter pattern 81. The second protrusion 91$p$2 may be interposed between the second lower dielectric layer 93$b$ and the third lower dielectric layer 93$c$. The second protrusion 91$p$2 may contact the second lower dielectric layer 93$b$, the third lower dielectric layer 93$c$ and the intermediate supporter pattern 83. The third protrusion 91$p$3 may contact a side surface of the etch stop layer ESL and the first lower dielectric layer 93$a$.

The upper storage node electrode 91$d$ may include a protrusion 91$pu$. The protrusion 91$pu$ may be interposed between the third lower dielectric layer 93$c$ and the upper supporter pattern 85.

In an embodiment, the storage node electrode 91 disposed adjacent to the opening OP of the supporter pattern 80 may include a first side surface SS1 including a concave/convex profile according to formation of the protrusion 91$p$1, and a second side surface SS2 including a flat profile. The first side surface SS1 may contact the lower dielectric layer 93L, the lower supporter pattern 81 and the intermediate supporter pattern 83. The first side surface SS1 may contact the upper supporter pattern 85. The second side surface SS2 may be completely covered by the upper dielectric layer 93U.

FIGS. 3 to 14 are cross-sectional views illustrating a method for forming the semiconductor device 100A according to the embodiment of the present disclosure shown in FIG. 1C.

Figure 3:
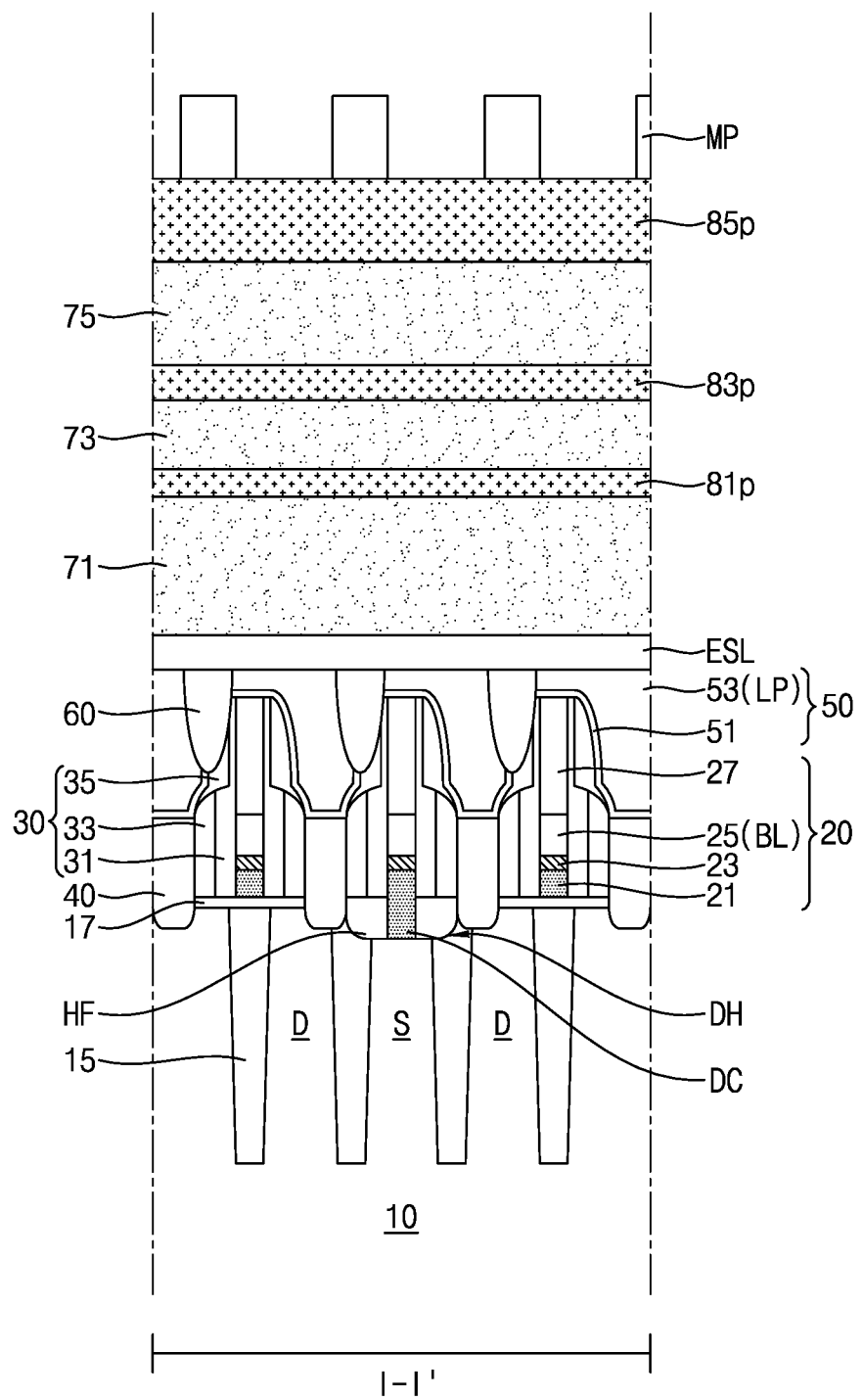
FIGS. 3 to 14 are cross-sectional views illustrating a method for forming the semiconductor device according to an embodiment of the present disclosure shown in FIG. 1C.

Referring to FIG. 3, the method may include formation of a mold structure on the substrate 10 and formation of a mask pattern MP on the mold structure.

Formation of the mold structure may include sequential formation of an etch stop layer ESL, a first mold layer 71, a lower supporter layer 81p, a second mold layer 73, an intermediate supporter layer 83p, a third mold layer 75, and an upper supporter layer 85p.

The etch stop layer ESL may completely cover upper surfaces of landing pads 53 and pad-isolation insulating layers 60. The etch stop layer ESL may include silicon nitride (SiN) or silicon oxynitride (SiON).

The first mold layer 71 may be formed over the etch stop layer ESL. The first mold layer 71 may include a material having etch selectivity with respect to the etch stop layer ESL. For example, the first mold layer 71 may include silicon oxide ($SiO_2$).

The lower supporter layer 81p may be formed over the first mold layer 71. The lower supporter layer 81p may include a material having etch selectivity with respect to the first mold layer 71. For example, the lower supporter layer 81p may include at least one of silicon nitride (SiN), silicon oxynitride (SiON), or silicon carbonitride (SiCN).

The second mold layer 73 may be formed over the lower supporter layer 81p. The second mold layer 73 may include a material having etch selectivity with respect to the lower supporter layer 81p. For example, the second mold layer 73 may include silicon oxide ($SiO_2$).

The intermediate supporter layer 83p may be formed over the second mold layer 73. The intermediate supporter layer 83p may include a material having etch selectivity with respect to the second mold layer 73. For example, the intermediate supporter layer 83p may include at least one of silicon nitride (SiN), silicon oxynitride (SiON), or silicon carbonitride (SiCN).

The third mold layer 75 may be formed over the intermediate supporter layer 83p. The third mold layer 75 may include a material having etch selectivity with respect to the intermediate supporter layer 83p. For example, the third mold layer 75 may include silicon oxide ($SiO_2$).

The upper supporter layer 85p may be formed over the third mold layer 75. The upper supporter layer 85p may include a material having etch selectivity with respect to the third mold layer 75. The upper supporter layer 85p may include a material exhibiting degraded step coverage. For example, the upper supporter layer 85p may include at least one of silicon carbonitride (SiCN) or silicon boronitride (SiBN).

A mask layer may be formed over the upper supporter layer 85p. The mask layer may be patterned to form a mask pattern MP and, as such, an upper surface of the upper supporter layer 85p may be selectively exposed. The mask layer may include a material having etch selectivity with respect to the upper supporter layer 85p. For example, the mask layer may include at least one of a polysilicon layer, an amorphous silicon layer, a silicon oxide layer, a silicon oxynitride layer, a spin-on hard (SOH) mask layer, or a polymer organic layer.

Figure 4:
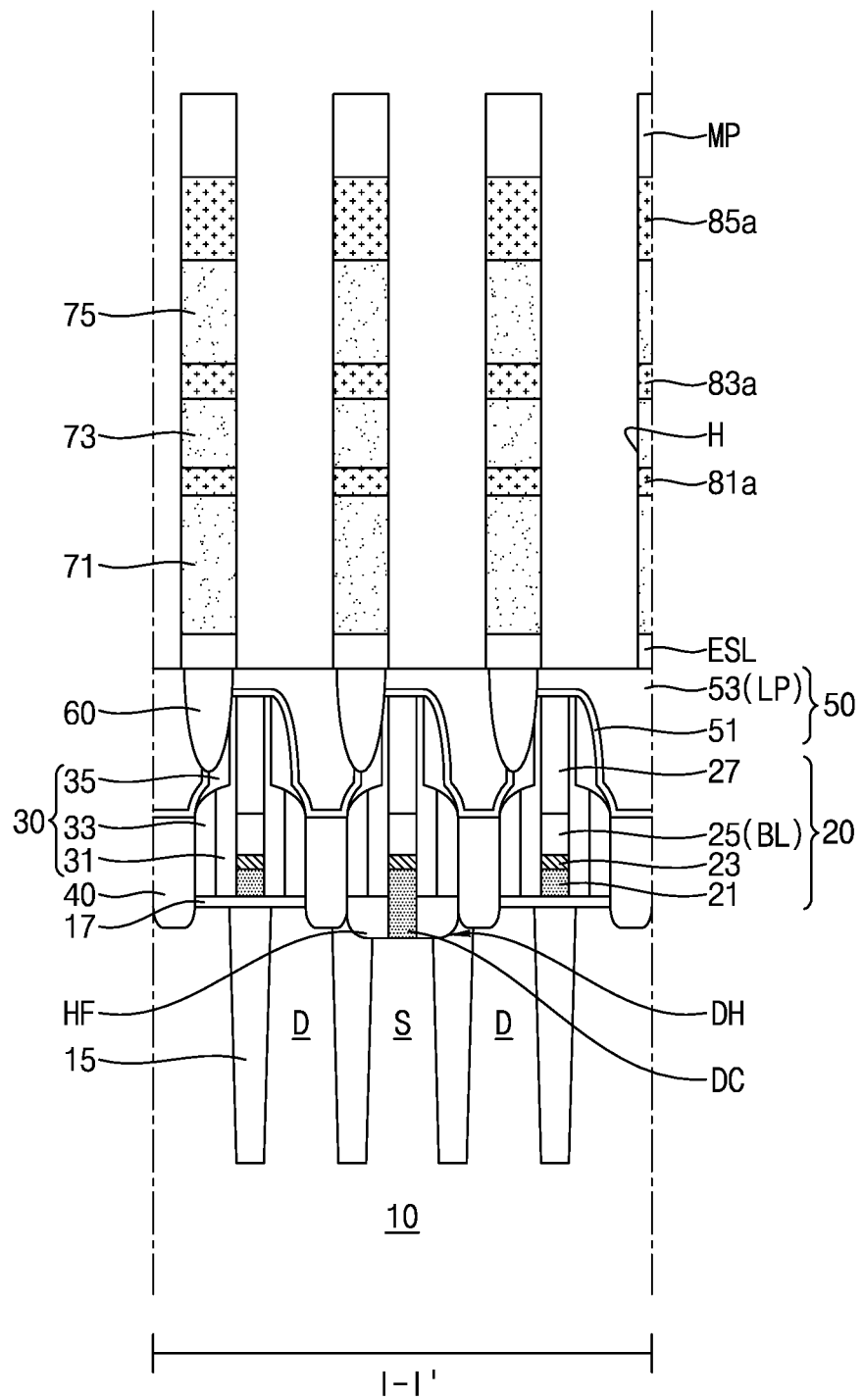

Referring to FIG. 4, the method may include formation of storage node electrode holes H to expose upper surfaces of the landing pads 53 therethrough, respectively. The storage node electrode holes H may be formed by patterning the mold structures using the mask pattern MP as an etch mask. The storage node electrode holes H may be formed through an anisotropic etching process. After formation of the storage node electrode holes H, the mask pattern MP may be removed. The process of removing the mask pattern MP will be described in detail later (with reference to FIGS. 17 to 33).

The storage node electrode holes H may extend through the mold structure, for example, the etch stop layer ESL, the first mold layer 71, a preliminary supporter pattern 81a, the second mold layer 73, a preliminary intermediate supporter pattern 83a, the third mold layer 75, and a preliminary upper supporter pattern 85a. Each storage node electrode hole H may have a uniform width. In an embodiment, each storage node electrode hole H may have a width gradually decreasing as the storage node electrode hole H extends toward the substrate 10. After formation of the storage node electrode holes H, a cleaning process may be performed to remove impurities produced during formation of the storage node electrode holes H.

Figure 5:
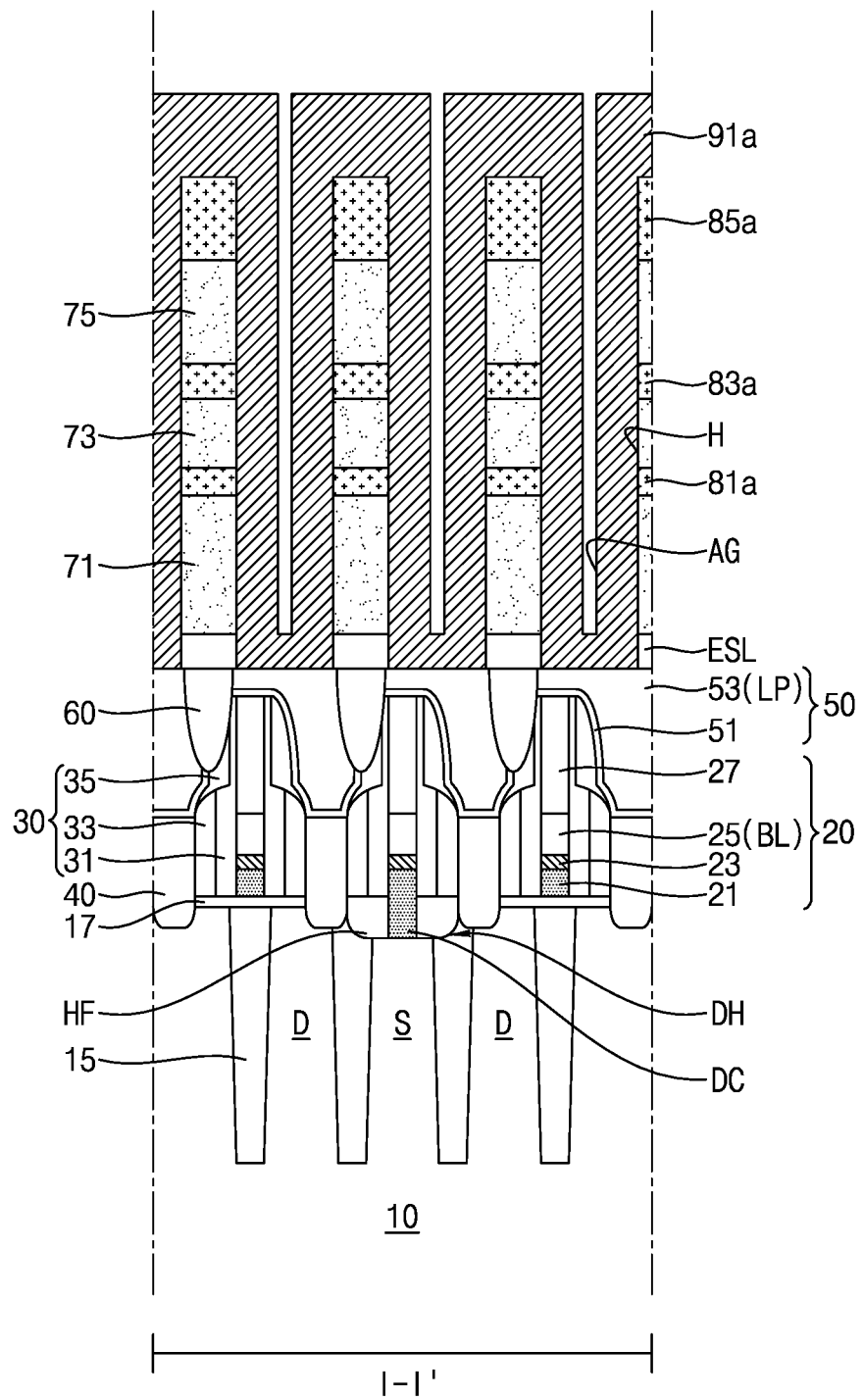
Figure 6:
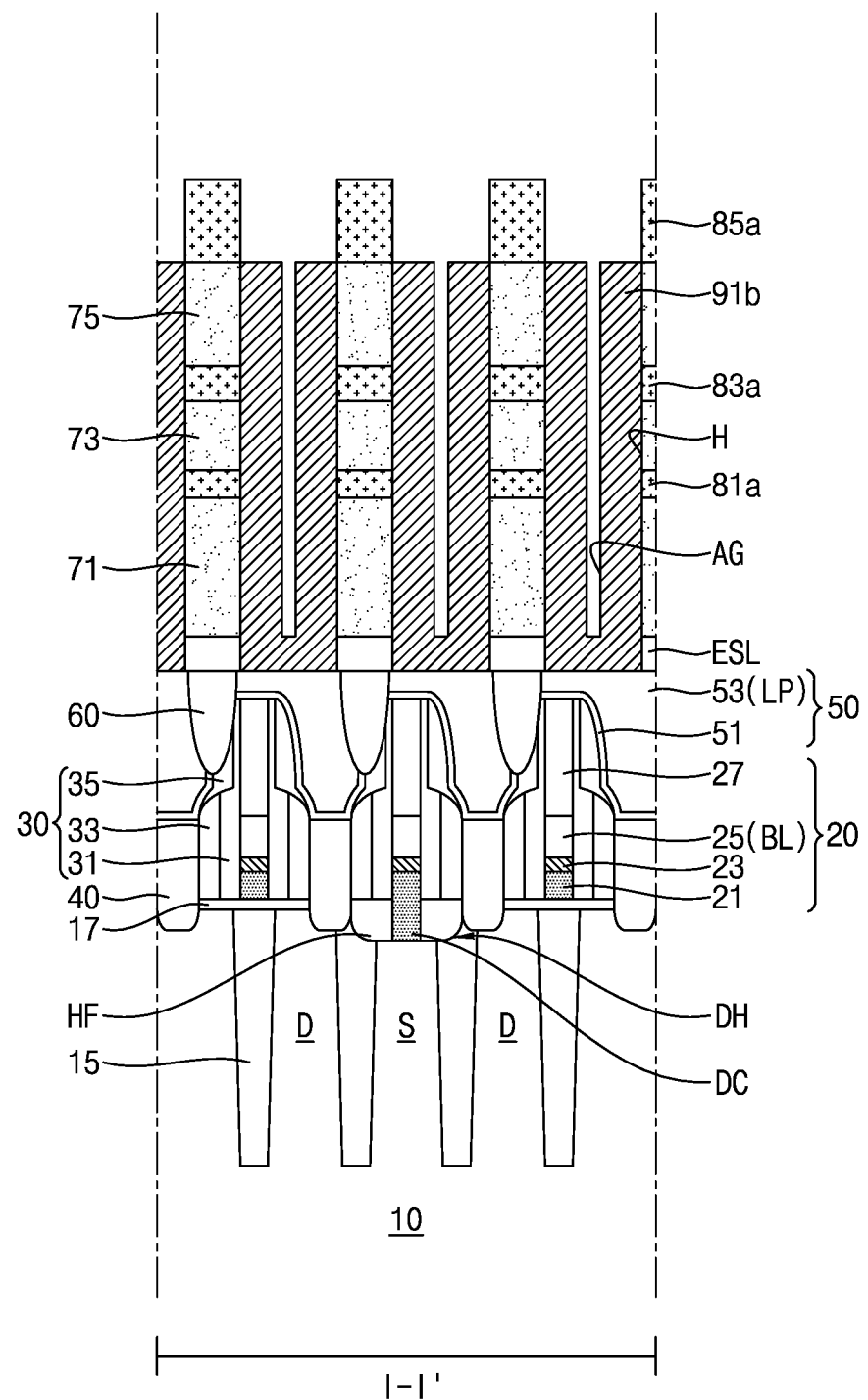

Referring to FIGS. 5 and 6, the method may include formation of lower storage node electrodes 91b at least partially filling respective storage node electrode holes H. An electrode material layer 91a may at least partially cover an upper surface of the preliminary upper supporter pattern 85a while at least partially filling the storage node electrode holes H. The electrode material layer 91a may include metal or metal nitride. For example, the electrode material layer 91a may include titanium nitride (TiN). The electrode material layer 91a may be formed through a process such as chemical vapor deposition (CVD), atomic layer deposition (ALD) or plasma enhanced atomic layer deposition (PEALD).

In an embodiment, the electrode material layer 91a might only partially fill each storage node electrode hole H such that the electrode material layer 91a may include an air gap AG disposed therein. The air gap AG may be formed as an aspect ratio of the storage node electrode hole H increases in accordance with increased fineness of the resultant semiconductor device. The air gap AG may extend lengthwise from an upper portion of the electrode material layer 91a toward the substrate 10. For example, the air gap AG may extend to a level lower than the preliminary lower supporter pattern 81a. An upper end of the air gap AG may be exposed at an upper surface of the electrode material layer 9I a such that the upper end may be opened. Accordingly, the electrode material layer 91a may have a cylinder shape formed with an empty space therein. In an embodiment, the upper end of the air gap AG might not be opened by the electrode material layer 91a. In this case, it may be possible to expose the air gap AG by partially etching the electrode material layer 91a.

The electrode material layer 91a may be partially removed through a partial etch-back process, thereby forming lower storage node electrodes 91b. As the electrode material layer 91a is partially removed, the preliminary upper supporter pattern 85a may be exposed. An upper end of each lower storage node electrode 91b may be disposed at substantially the same level as a lower end of the preliminary upper supporter pattern 85a or at a slightly higher level than the lower end of the preliminary upper supporter pattern 85a.

Figure 7:
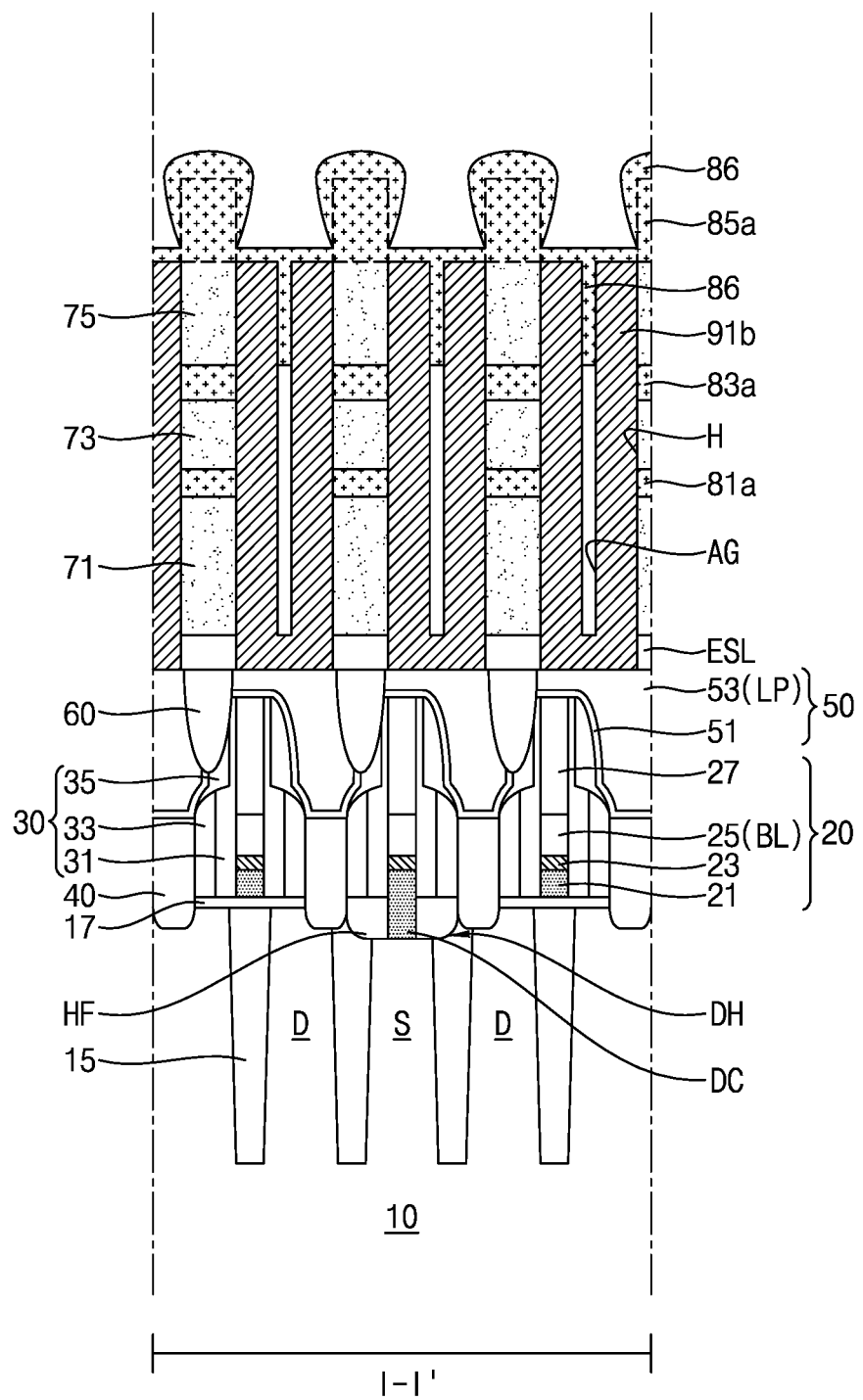

Referring to FIG. 7, the method may include formation of a capping layer 86 at least partially covering the lower storage node electrodes 91b and the preliminary upper supporter pattern 85a. The capping layer 86 may fill at least a portion of the air gap AG in each lower storage node electrode 91b. In an embodiment, the capping layer 86 may completely fill the air gap AG.

The capping layer 86 may be formed using a method exhibiting degraded step coverage such as plasma enhanced chemical vapor deposition (PECVD). The capping layer 86 may be non-conformally formed on the preliminary upper supporter pattern 85a. For example, the thickness of a portion of the capping layer 86 formed on an upper surface of the preliminary upper supporter pattern 85a may be greater than the thickness of a portion of the capping layer 86 formed on a side surface of the preliminary upper supporter pattern 85a. The thickness of the capping layer 86 on each side surface of the preliminary upper supporter pattern 85a may be non-uniform. For example, the portion of the capping layer 86 at least partially covering each side surface of the preliminary upper supporter pattern 85a may have a greater thickness at an upper part thereof than at lower part thereof. Accordingly, the capping layer 86 at least partially covering the preliminary upper supporter pattern 85a may have a convex surface.

The capping layer 86 may include a material exhibiting degraded step coverage. In an embodiment, the capping layer 86 may include the same material as the preliminary upper supporter pattern 85a. For example, the capping layer 86 may include at least one of silicon carbonitride (SiCN) or silicon boronitride (SiBN).

Figure 8:
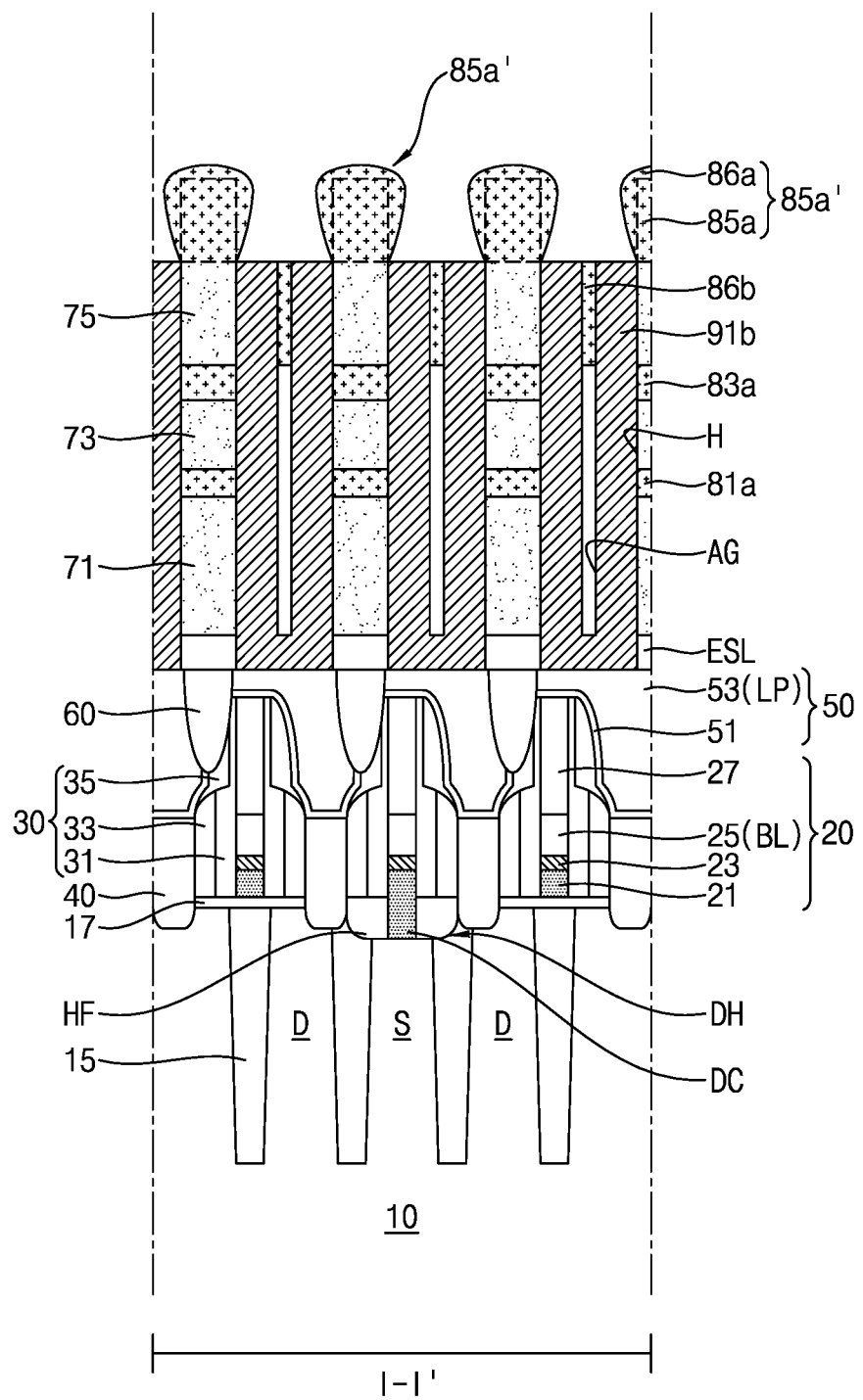

Referring to FIG. 8, the method may include formation of fillers 86b and a preliminary upper supporter pattern 85a' through partial removal of the capping layer 86 using a partial etch-back process. As the capping layer 86 is partially etched, the capping layer 86 may be physically separated into the fillers 86b and the preliminary upper supporter pattern 85a'. The fillers 86b may be formed as the capping layer 86 is partially removed to expose the upper surface of each lower storage node electrode 91b, and the fillers 86b may be partially left in the air gaps AG. As the portion of the capping layer 86 disposed on the preliminary upper supporter pattern 85a is etched, a supporter capping layer 86a having a smaller thickness than the capping layer 86 may be formed. The supporter capping layer 86a is spaced apart from each filler 86b. The preliminary upper supporter pattern 85a' may have a greater thickness than the preliminary upper supporter pattern 85a before formation of the capping layer 86. Surfaces of the preliminary upper supporter pattern 85a' may be convex.

Figure 9:
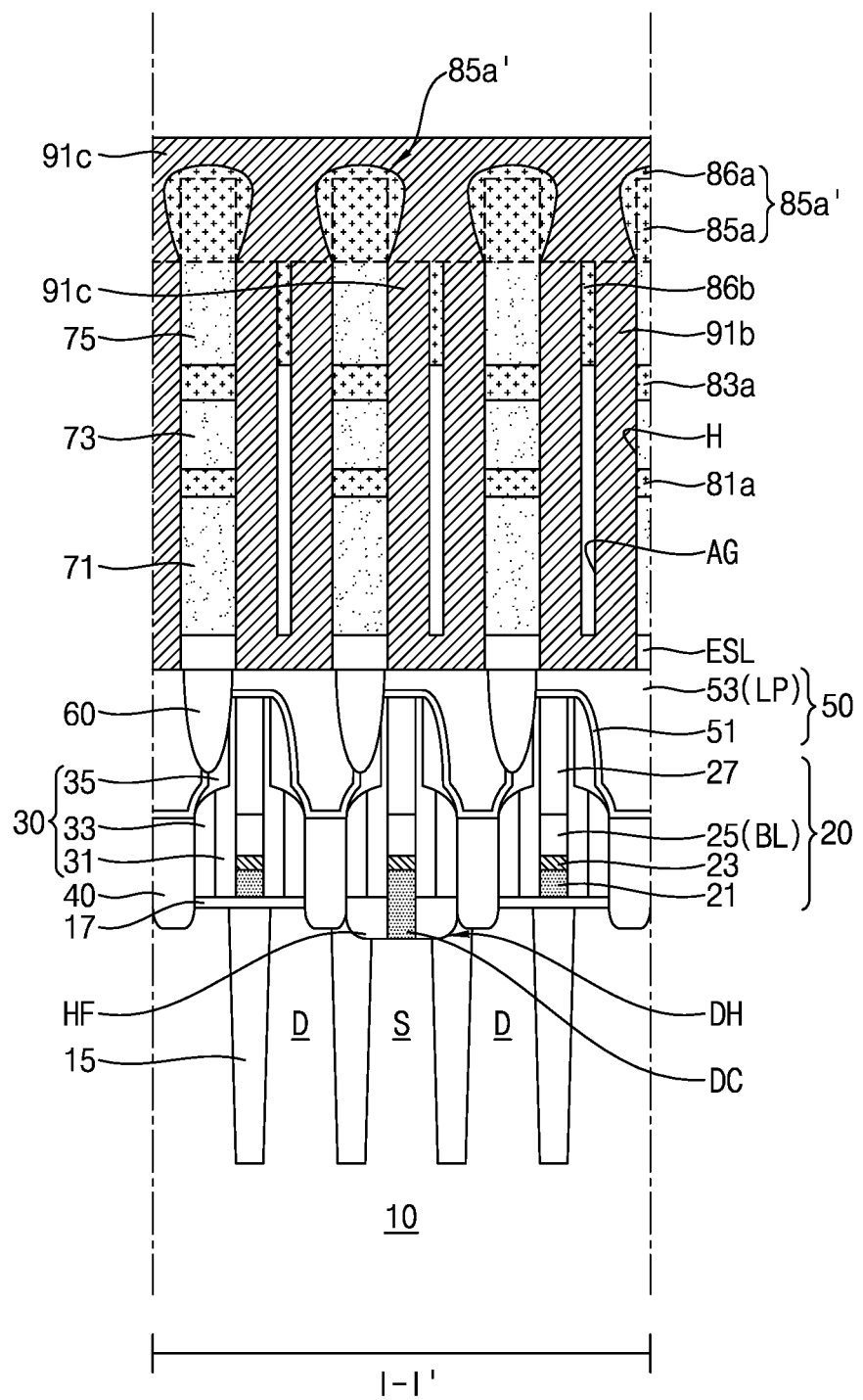
Figure 10:
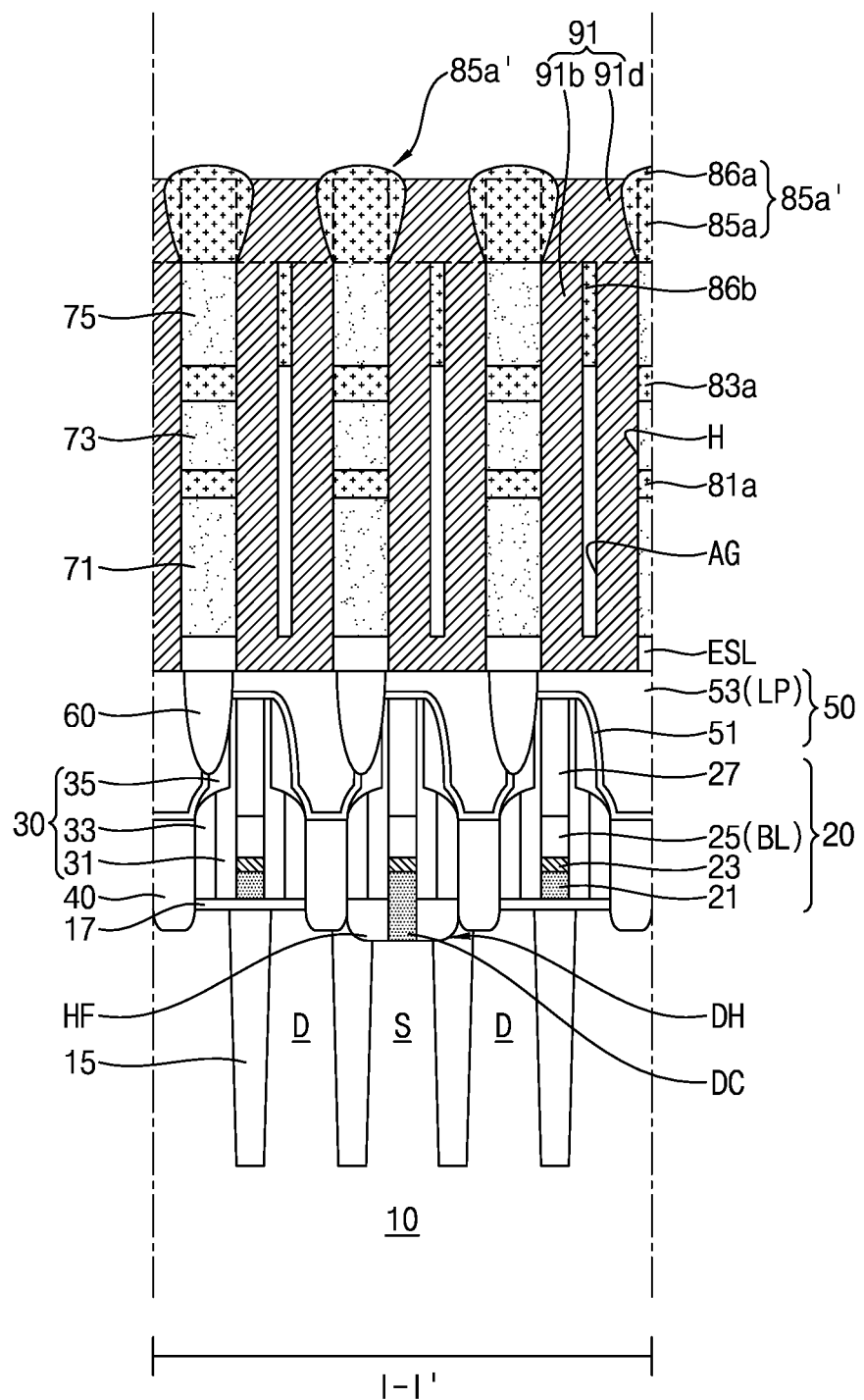

Referring to FIGS. 9 and 10, the method may include formation of storage electrodes 91 through formation of upper storage node electrodes 91d on respective lower storage node electrodes 91b.

The upper storage node electrodes 91d may be formed as an electrode material layer 91c at least partially covering the lower storage node electrodes 91b and the upper supporter pattern 85, and is then partially etched back. The electrode material layer 91c may be etched until an upper portion of the preliminary upper supporter pattern 85' is exposed. An upper end of each upper storage node electrode 91d may be disposed at a lower level than an upper end of the preliminary upper supporter pattern 85'. Each upper storage node electrode 91d may be connected to the corresponding lower storage node electrode 91b, and may at least partially cover an upper end of the corresponding filler 86b. Each lower storage node electrode 91b and the corresponding upper storage node electrode 91d form one storage node electrode 91. The storage node electrode 91 may have one filler 86b disposed therein.

Figure 11:
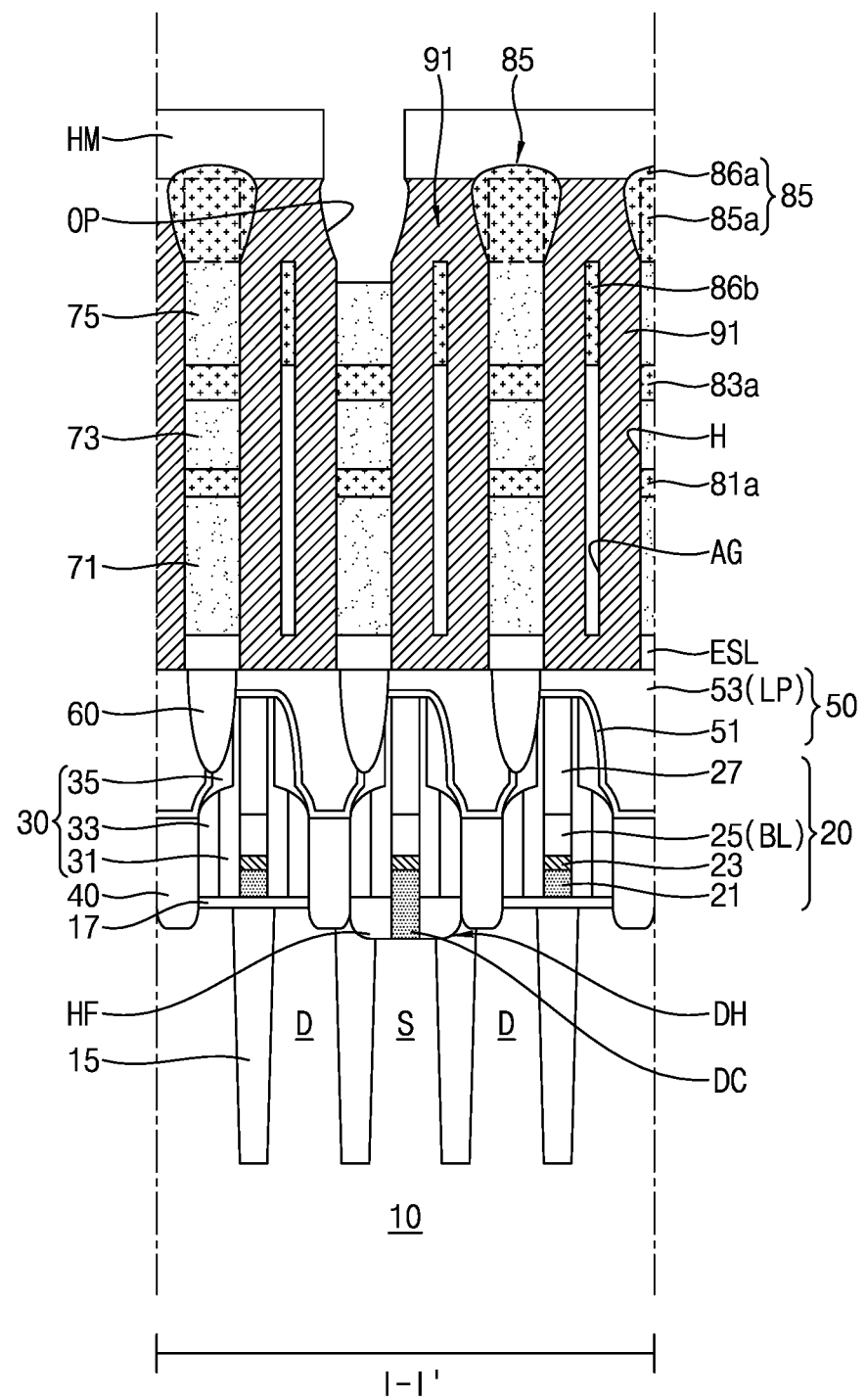

Referring to FIG. 11, the method may include formation of an upper supporter pattern 85 and an opening OP through partial etching of the preliminary upper supporter pattern 85a'. A hard mask pattern HM may be formed on the storage node electrodes 91 and the preliminary upper supporter pattern 85a' such that the upper surface of the preliminary upper supporter pattern 85a' is partially exposed through the hard mask pattern HM. An isotropic etching process using the hard mask pattern HM as an etch mask may be performed and, as such, an exposed portion of the preliminary upper supporter pattern 85a' may be etched. In a procedure in which the preliminary upper supporter pattern 85a' is anisotropically etched, the third mold layer 75 may also be partially etched. Through the opening OP, a portion of the third mold layer 75 and portions of side surfaces in corresponding ones of the storage node electrodes 91 may be exposed. The method may include removal of the hard mask pattern HM after formation of the openings OP.

Figure 12:
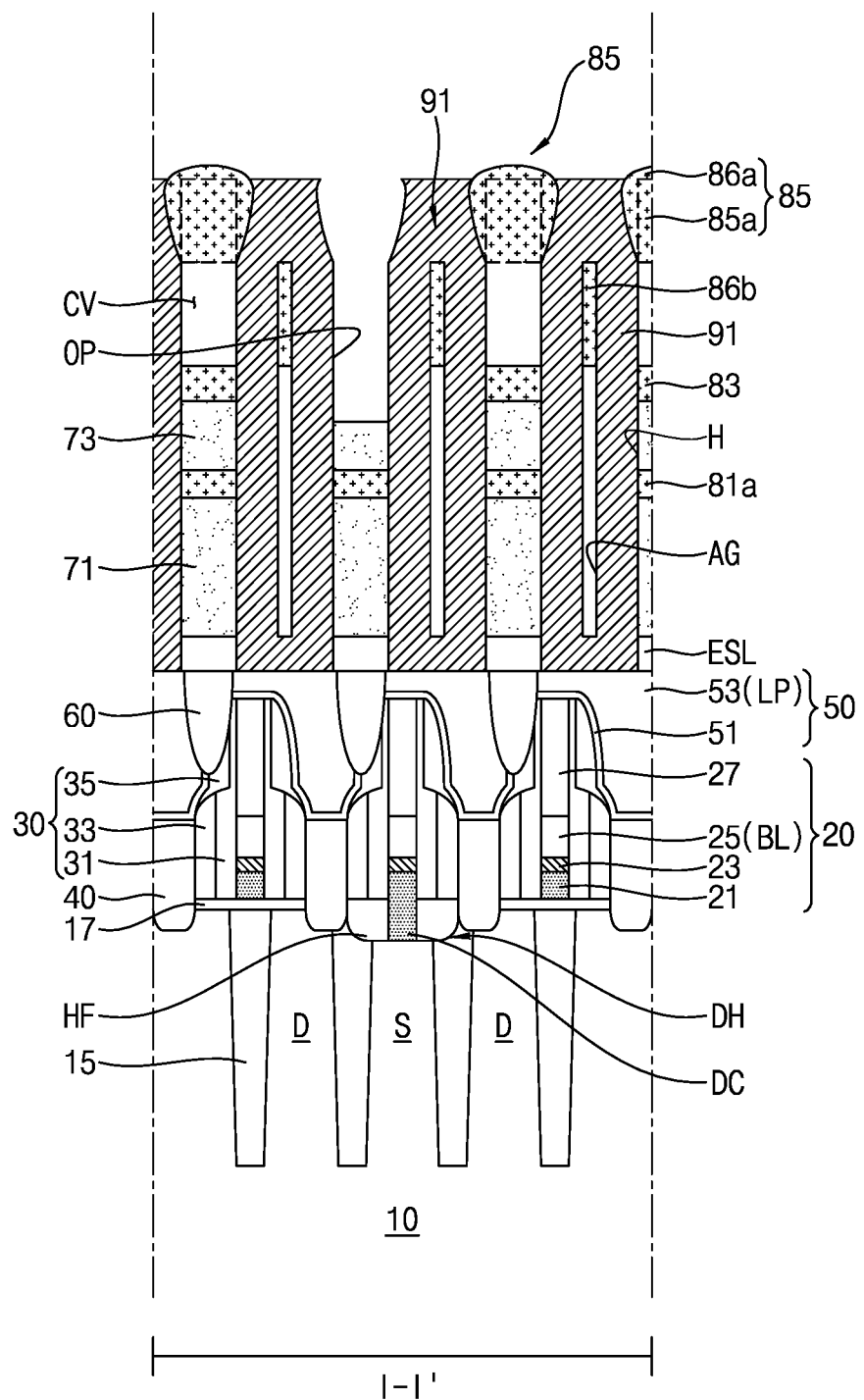

Referring to FIG. 12, the method may include formation of a cavity CV through removal of the third mold layer 75, and formation of an intermediate supporter pattern 83 through partial etching of the preliminary intermediate supporter pattern 83a. A wet etching process having etch selectivity with respect to the upper supporter pattern 85 and the preliminary intermediate supporter pattern 83a may be performed and, as such, the third mold layer 75 may be removed. The opening OP may further extend downwards, and a cavity CV may be formed between the upper supporter pattern 85 and the preliminary intermediate supporter pattern 83a. Through the cavity CV, an upper surface of the preliminary intermediate supporter pattern 83a, a lower surface of the upper supporter pattern 85 and portions of side surfaces of the corresponding storage node electrodes 91 may be exposed. A portion of the preliminary intermediate supporter pattern 83a exposed through the opening OP may be partially exposed and, as such, an intermediate supporter pattern 83 may partially expose the second mold layer 73. In a procedure in which the preliminary intermediate supporter pattern 83a is partially etched, the second mold layer 73 may be partially etched.

Figure 13:
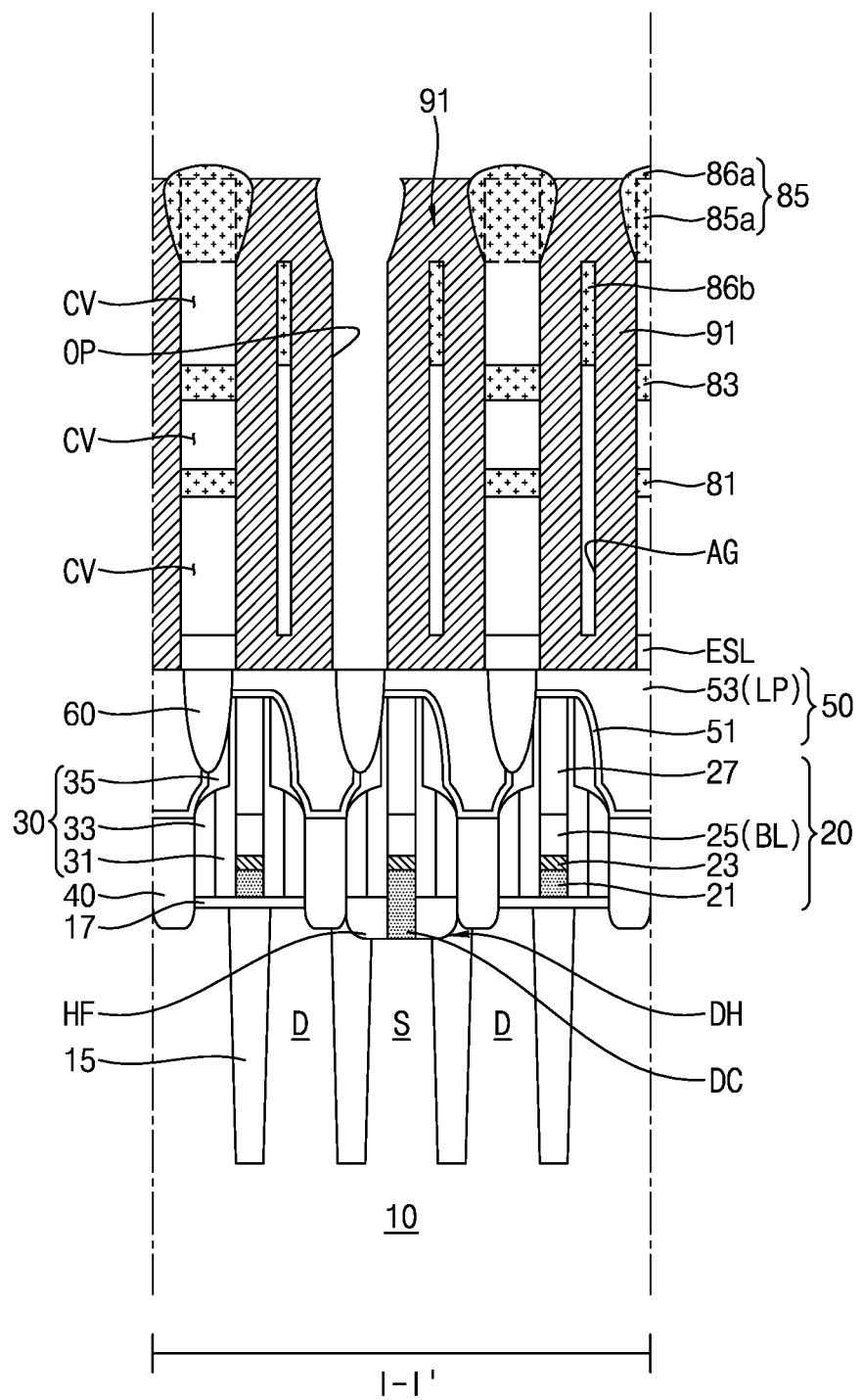

Referring to FIG. 13, the method may include formation of cavities CV through removal of the second mold layer 73 and the first mold layer 71, and formation of a lower supporter pattern 81 through partial etching of the preliminary lower supporter pattern 81a. Formation of the cavities and the lower supporter pattern 81 may be performed in a manner identical or similar to that of formation of the cavity CV and the intermediate supporter pattern 83 in FIG. 12. A lower surface of the intermediate supporter pattern 83, upper and lower surfaces of the lower supporter pattern 81, and an upper surface of the etch stop layer ESL may be exposed through the cavities CV. The opening OP may further extend downwards such that an upper surface of the pad-isolation insulating layer 60 may be exposed through the opening OP.

Figure 14:
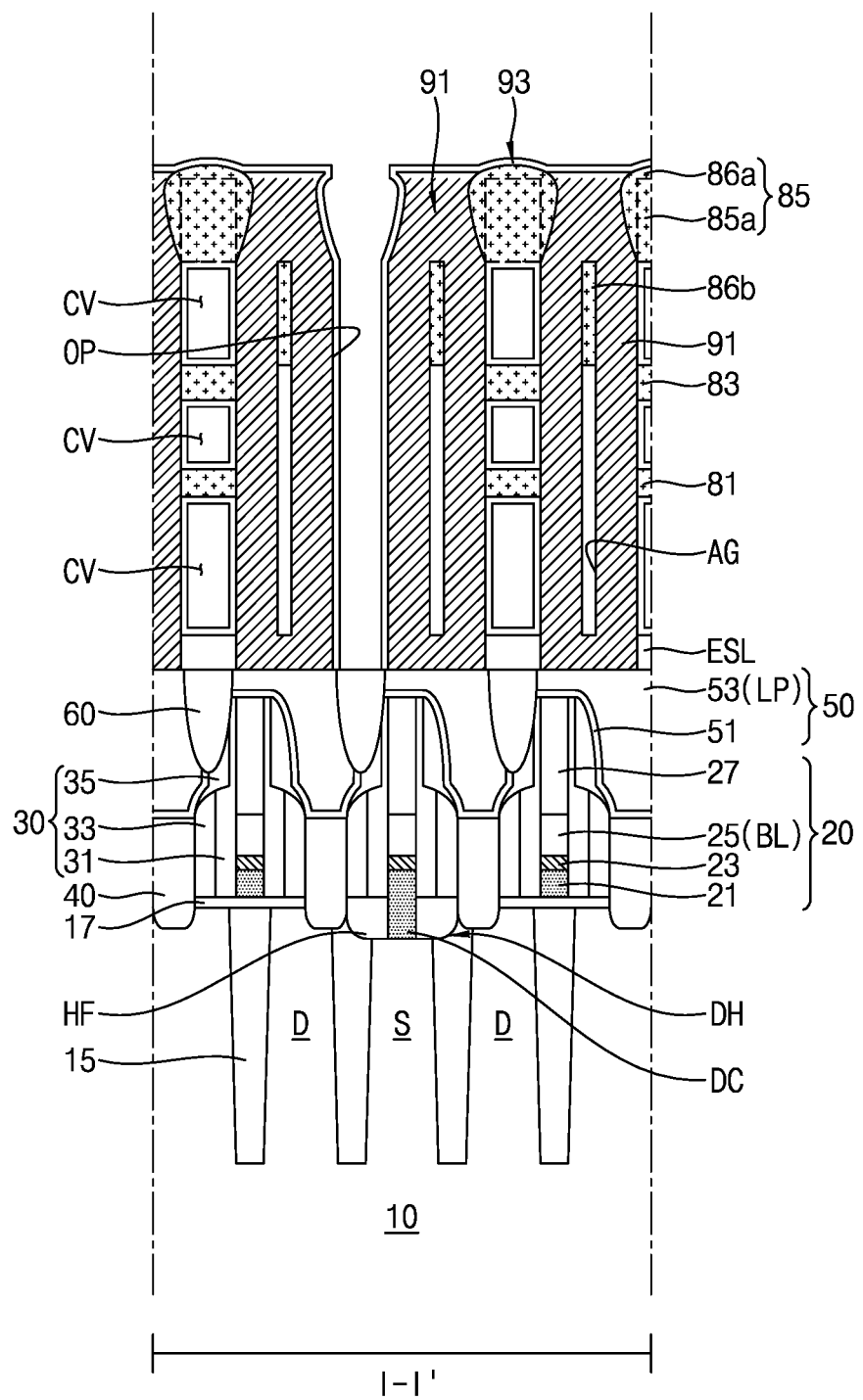

Referring to FIG. 14, the method may include formation of a dielectric layer conformally covering surfaces of the storage node electrodes 91, the lower supporter pattern 81, the intermediate supporter pattern 83 and the upper supporter pattern 85 exposed through the cavities CV and the opening OP. For example, the dielectric layer 93 may include at least one metal oxide such as hafnium oxide ($Hf_xO_y$), aluminum oxide ($Al_xO_y$), titanium oxide ($Ti_xO_y$), tantalum oxide ($Ta_xO_y$), ruthenium oxide ($Ru_xO_y$), lanthanum oxide ($La_xO_y$) or zirconium oxide ($ZrO_2$), a dielectric material having a perovskite structure such as $SrTiO_3$(STO), (Ba, Sr)$TiO_3$(BST), $BaTiO_3$, PZT or PLZT, silicon oxide or silicon nitride. The dielectric layer 93 may be formed using a method exhibiting superior step coverage such as CVD, PVD or ALD.

Again, referring to FIGS. 1A to 1D, the method may include formation of a plate electrode 95 at least partially filling the cavities CV and the opening OP on the dielectric layer 93. The plate electrode 95 may be formed using a deposition method such as CVD, physical vapor deposition (PVD) or ALD. The plate electrode 95 may include at least one of metal nitrides such as titanium nitride (TiN), titanium aluminum nitride (TiAlN) or tungsten nitride (WN). Alternatively, the plate electrode 95 may include at least one of platinum (Pt), ruthenium (Ru) or iridium (Ir).

Figure 15:
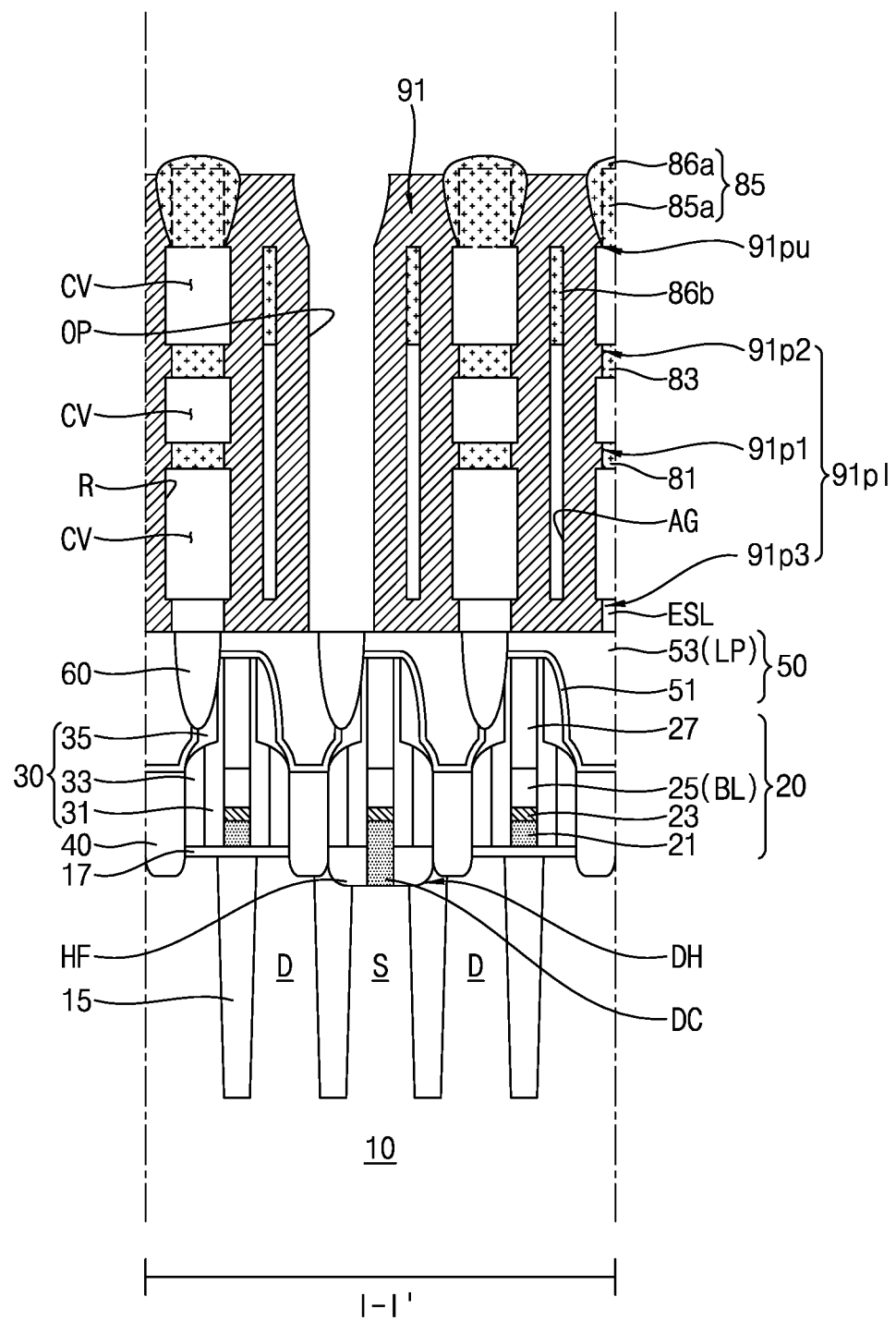
FIGS. 15 and 16 are cross-sectional views illustrating a method for forming the semiconductor device according to an embodiment of the present disclosure shown in FIG. 2A.
Figure 16:
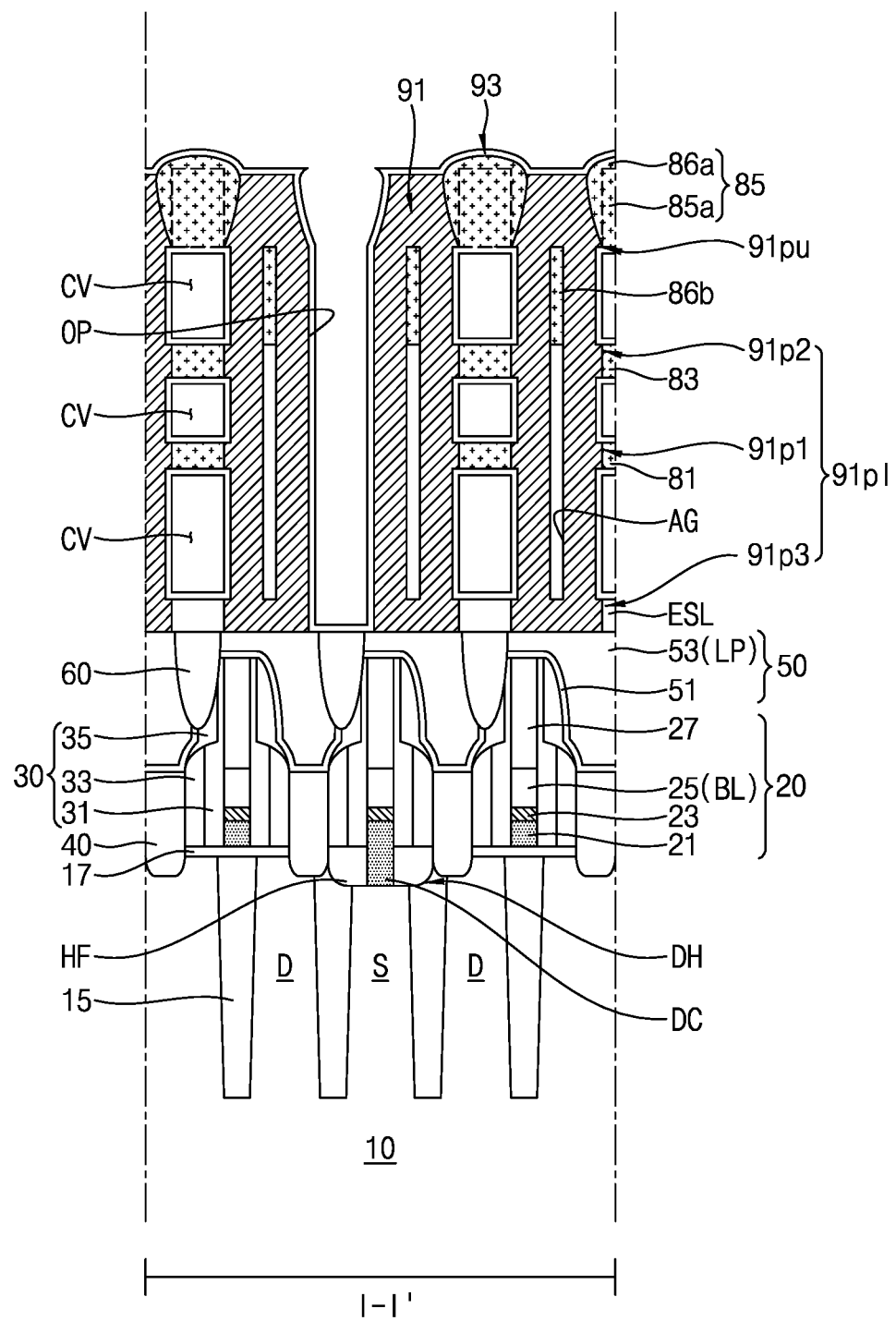

FIGS. 15 and 16 are cross-sectional views illustrating a method for forming the semiconductor device 100B according to the embodiment of the present disclosure shown in FIG. 2A.

Referring to FIG. 15, the method may further include formation of protrusions 91p1 and recesses R through partial etching of the storage node electrodes 91 after execution of the processes explained with reference to FIGS. 3 to 13.

Recesses R may be formed by selectively etching exposed side surfaces of the storage node electrodes 91 through a wet etching process having etch selectivity with respect to the lower supporter pattern 81, the intermediate supporter pattern 83 and the upper supporter pattern 85. In accordance with formation of the recesses R, horizontal widths of the cavities CV may be increased. Unexposed side surfaces of the storage node electrodes 91 contacting the lower supporter pattern 81 and the intermediate supporter pattern 83 during formation of the recesses R may be formed with protrusions 91p1 protruding outwards, as compared to side surfaces of the storage node electrodes 91 formed with the recesses R.

Referring to FIG. 16, the method may include formation of a dielectric layer 93. This method may form the dielectric layer 93 in the same manner as described with reference to FIG. 14. Referring to FIG. 2A, the method may include formation of a plate electrode 95. This method may form the plate electrode 95 in the same manner as described with reference to FIG. 1C.

FIGS. 17 to 22 are sectional views illustrating a method for forming semiconductor devices according to embodiments of the present disclosure. In the drawings which will be explained hereinafter, constituent elements disposed beneath a capacitor structure are shown.

Figure 17:
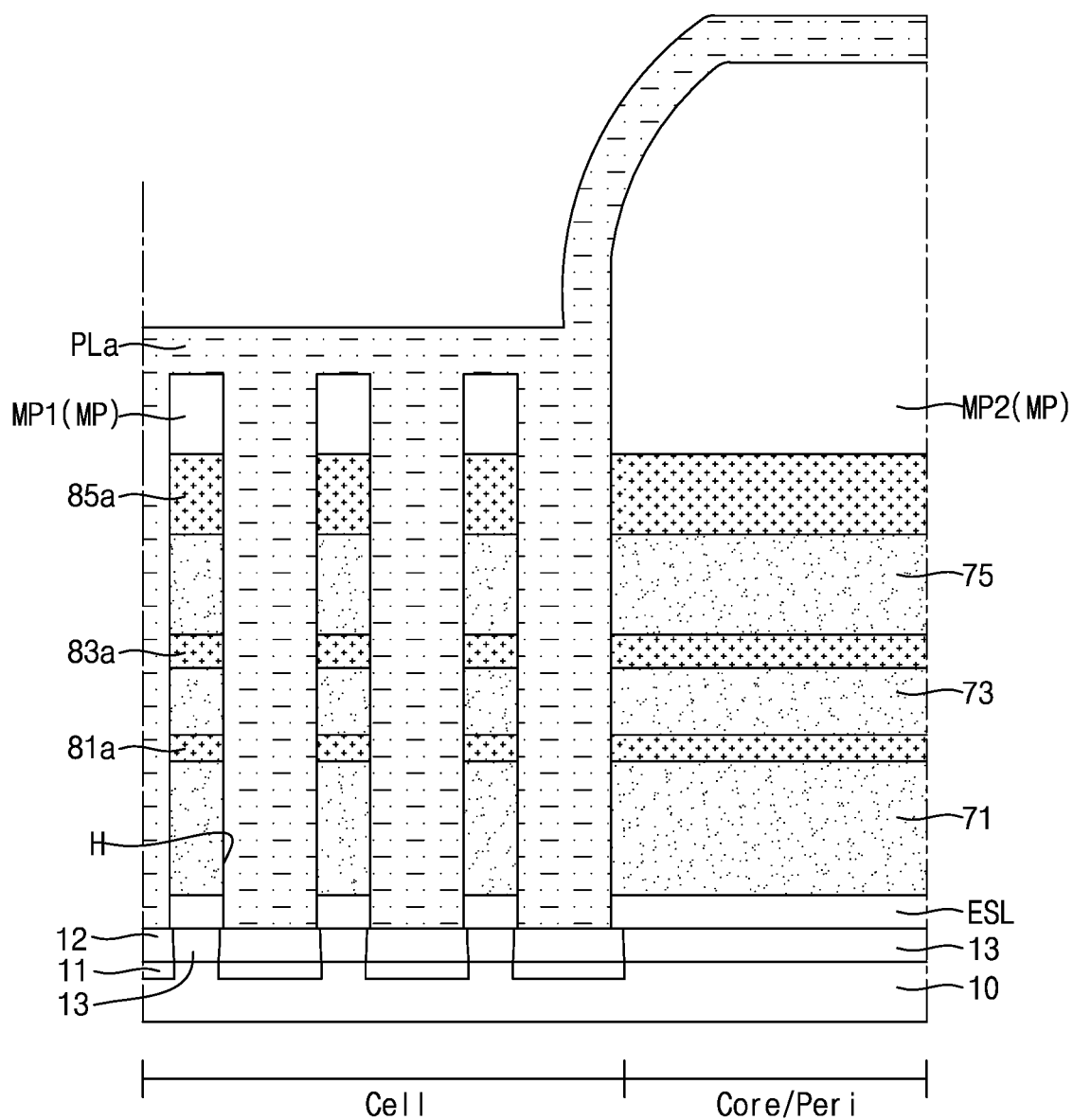
FIGS. 17 to 22 are sectional views illustrating a method for forming semiconductor devices according to embodiments of the present disclosure.

Referring to FIG. 17, the method may include formation of the storage node electrode holes H through execution of processes explained with reference to FIGS. 3 and 4, and formation of a passive layer PLa at least partially covering the mask pattern MP while at least partially filling the storage node electrode holes H.

First, the method may include preparation of a substrate 10 formed with semiconductor devices, and execution of the processes explained with reference to FIGS. 3 and 4 on the prepared substrate 10. The prepared semiconductor substrate 10 may include a cell area Cell where memory cells are formed, respectively, and a core/peri area Core/Peri configured to control the memory cells. Each semiconductor device formed in the cell area Cell of the semiconductor substrate 10 may include a lower structure 11 and a connection structure 12. For example, the lower structure may include source/drain regions ("S" and "D" in FIG. 4), whereas the connection structure 12 may include a storage node contact ("40" in FIG. 4) and a landing pad ("53" in FIG. 4). The connection structures 12 may be electrically isolated from one another by an insulating layer 13 on the substrate 10.

The mold structure may be formed on the substrate 10. The mask pattern MP may be formed on the mold structure. The mask pattern MP may have a pattern shape to define regions in which the storage node electrode holes H for exposure of the connection structures 12 (for example, landing pads) will be formed, respectively, in the cell area Cell.

The storage node electrode holes H may be formed in the cell area through an anisotropic etching process using the mask pattern MP as an etch mask. The mask pattern MP may also be partially etched in the procedure of forming the storage node electrode holes H. In accordance with etching of the mask pattern MP, a first mask pattern MP1 having a relatively small thickness may be formed in the cell area Cell, and a second mask pattern MP2 having a relatively greater thickness than the first mask pattern MP1 may be formed in the core/peri area Core/Peri. The storage node electrode holes H formed in the cell area Cell may have a relatively higher density than holes formed in the core/peri area Core/Peri. Accordingly, in the etching process of forming the holes, the mask pattern MP in the cell area Cell may be removed at relatively high etching intensity. As a result, the first mask pattern MP1 may have a relatively smaller thickness than the second mask pattern MP2.

The passive layer PLa may at least partially cover the mask pattern MP while at least partially filling the storage node electrode holes H. The passive layer PLa may include a material which does not produce by-products (for example, inactive polymer such as $TiF_x$) even when the passive layer PLa is exposed to etching gas in a subsequent process. For example, the passive layer PLa may include at least one of titanium nitride (TiN), a spin-on hard mask, an amorphous carbon layer or tin oxide ($SnO_x$).

Figure 18:
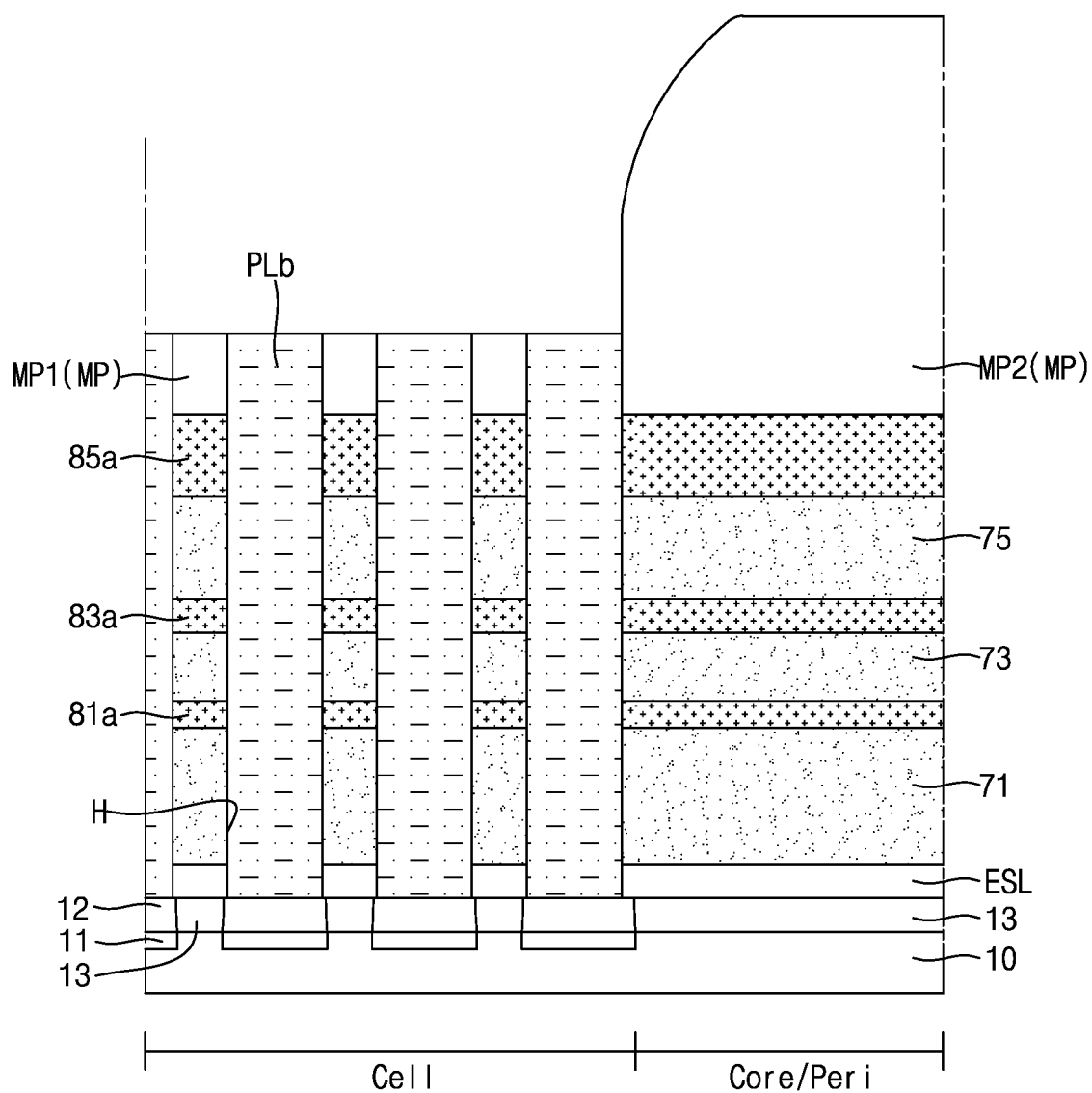

Referring to FIG. 18, the method may include formation of a passive pattern PLb and exposure of an upper surface of the mask pattern MP through removal of a portion of the passive layer PLa using a partial etch-back process.

Figure 19:
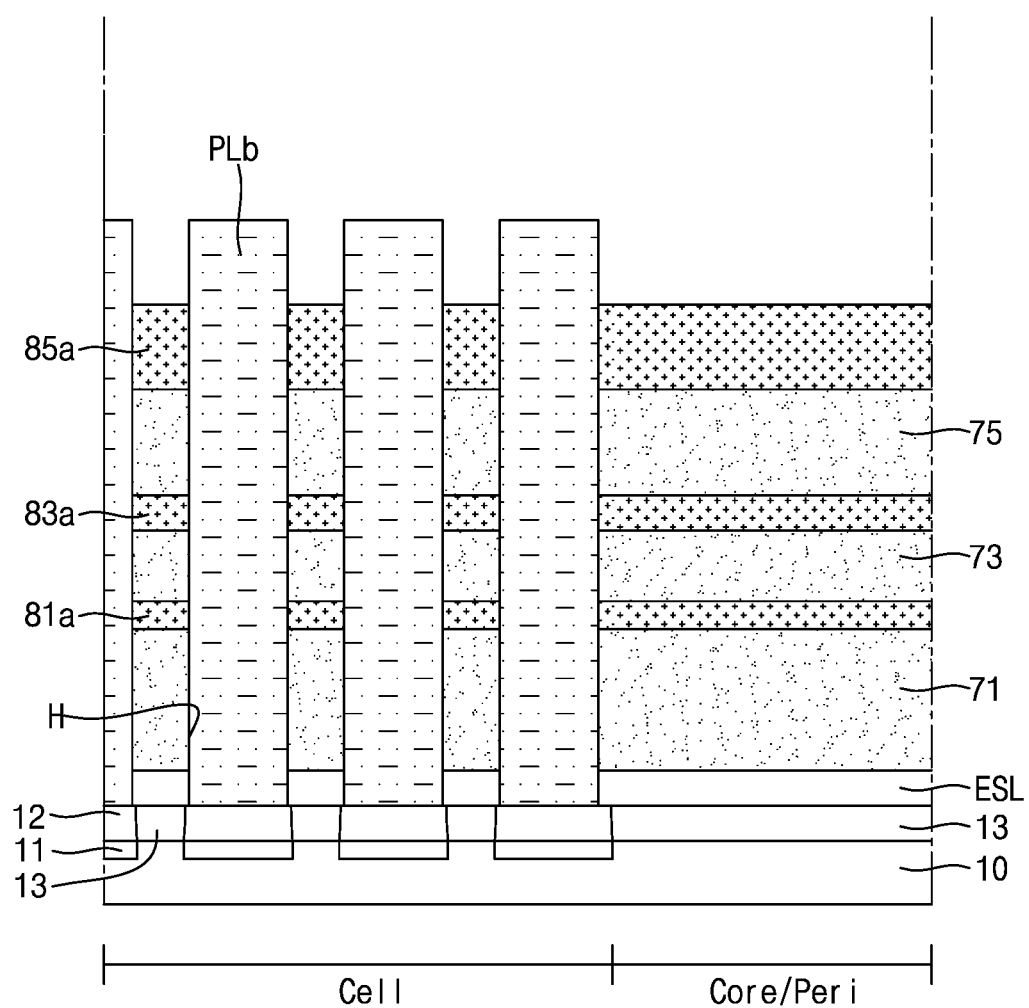

Referring to FIG. 19, the method may include removal of the mask pattern MP through an etch-back process, and wet cleaning through an ammonium hydroxide DIW mixture (ADM) process. In the process of etching back the mask pattern MP, the passive pattern PLb may also be partially removed. The passive pattern PLb may be left in a protruded state above the upper surface of the preliminary upper supporter pattern 85a.

In an embodiment, the method may include removal of the mask pattern MP using a dry cleaning process. The dry cleaning process may use an etching material capable of selectively removing polysilicon included in the mask pattern MP. For example, when the mask pattern MP is removed using a radical dry cleaning process, it may be possible to selectively remove the mask pattern MP without damage to the preliminary upper supporter pattern 85a. The etching material used in the dry cleaning process may be appropriately selected in accordance with compositions of the preliminary upper supporter pattern 85a and the mask pattern MP. For example, the etching material may include $NF_3$.

Figure 20:
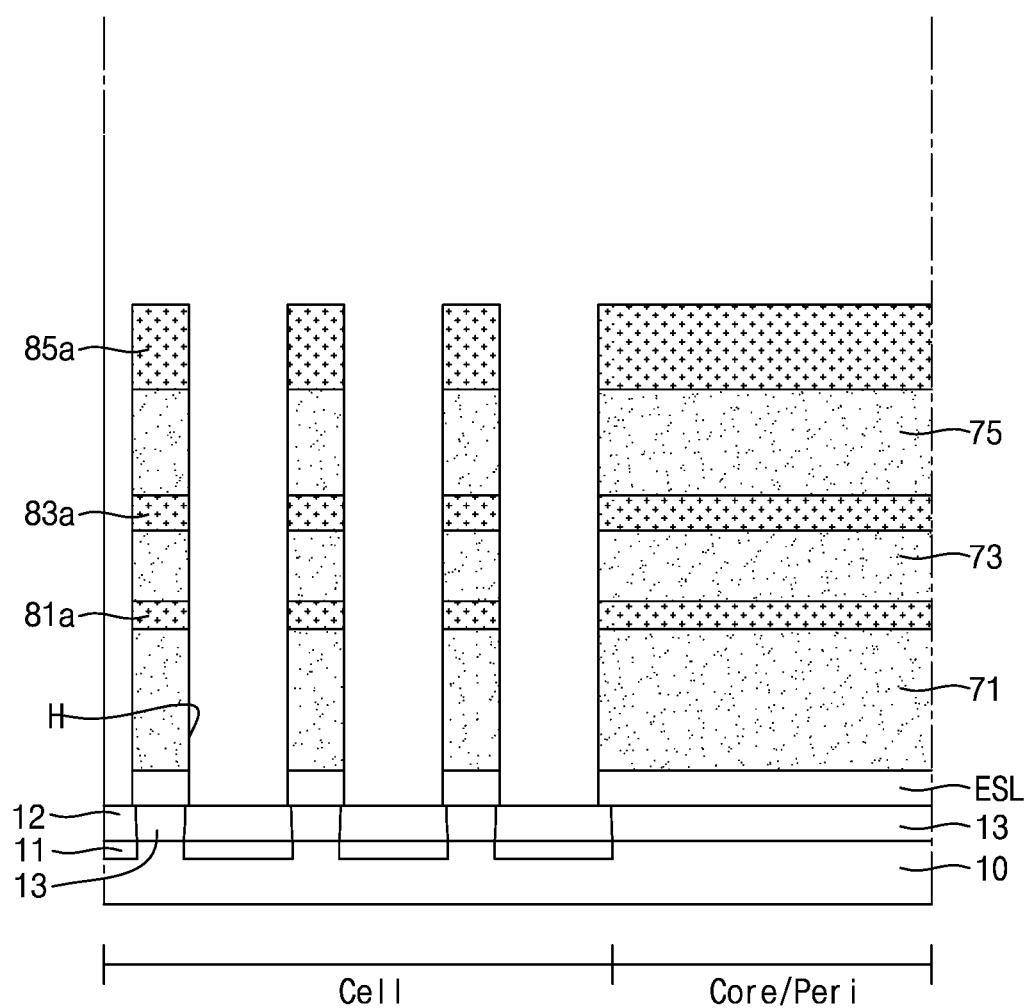

Referring to FIG. 20, the method may include removal of the passive pattern PLb. The passive pattern PLb may be removed through an $H_2$ or $O_2$ ashing process. In accordance with removal of the passive pattern PLb, the storage node electrode holes H may be opened, and an upper surface of the connection structure 12 may be exposed. For example, upper surfaces of the landing pads may be exposed through the storage node electrode holes H, respectively. Thereafter, the processes explained with reference to FIGS. 5 to 16 may be performed.

Figure 21:
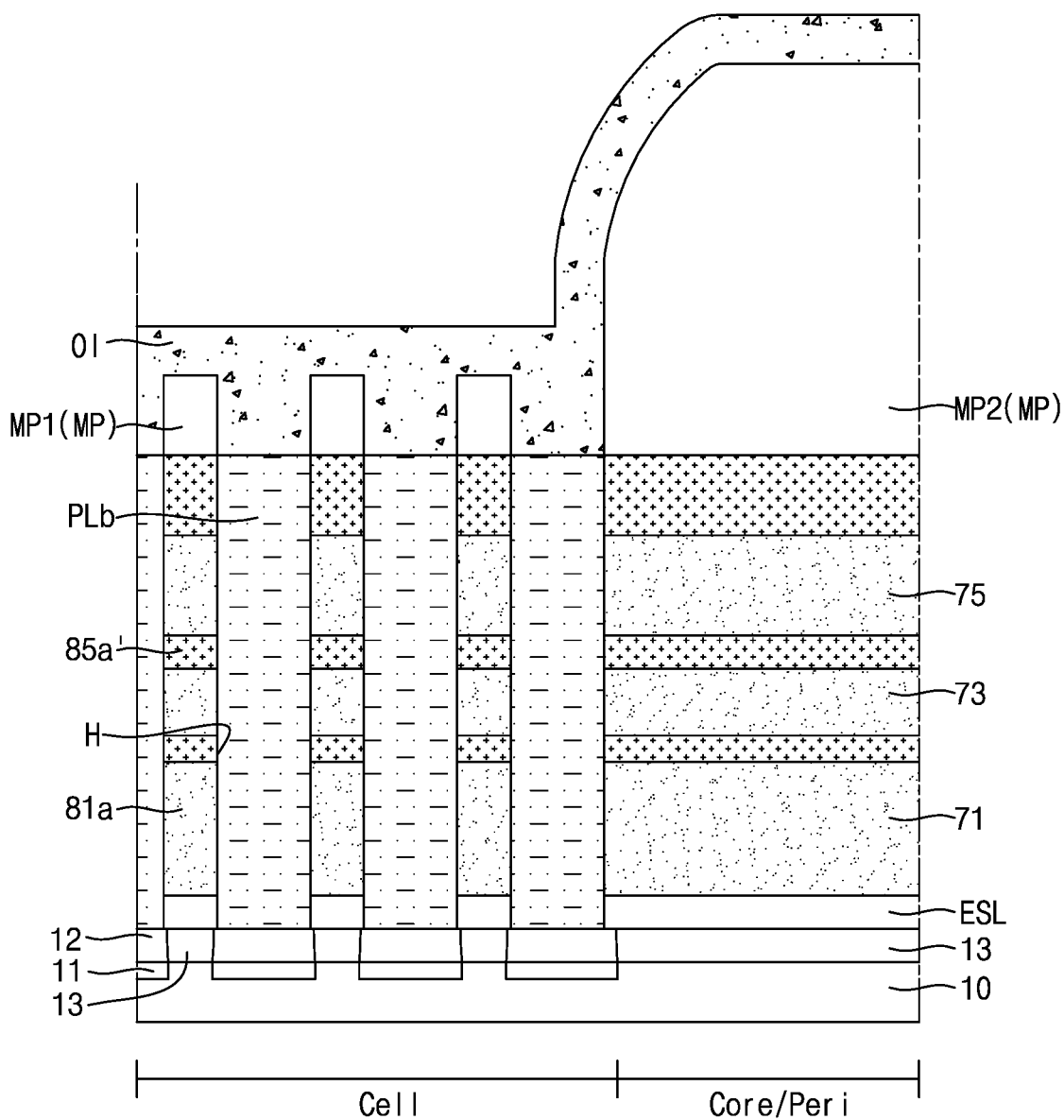
Figure 22:
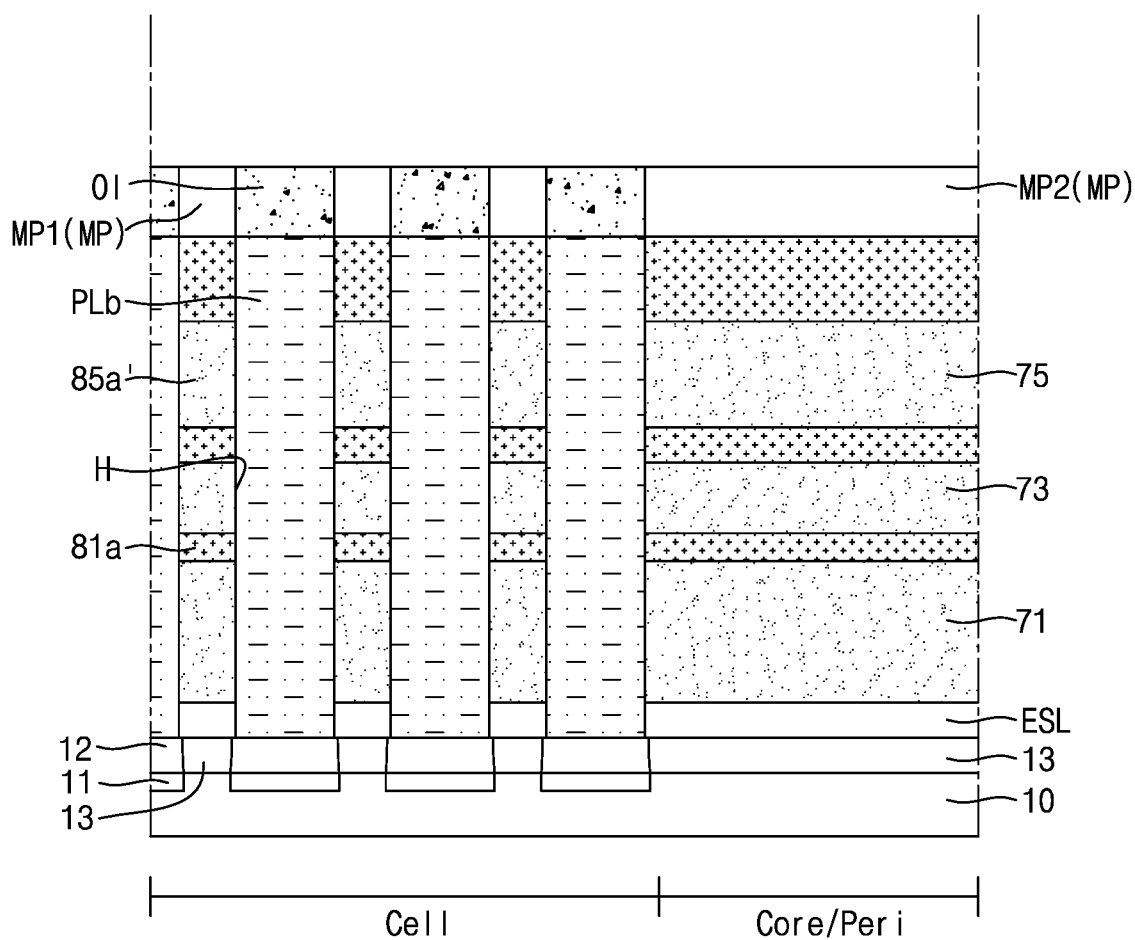

Referring to FIGS. 21 and 22, the method may further include formation of a cover layer O1 to at least partially cover the passive pattern PLb and the mask pattern MP and planarization of the cover layer O1 and the mask pattern MP, which are performed after the process of forming the passive pattern PLb in FIG. 18. Referring to FIG. 21, formation of the cover layer O1 may include partial removal of the passive pattern PLb through a partial etch-back process. The passive pattern PLb may have a smaller height than the first mask pattern MP1 and, as such, side surfaces of the first mask pattern MP1 may be exposed. The cover layer O1 may at least partially cover an upper surface of the passive pattern PLb and upper and side surfaces of the mask pattern MP. The cover layer O1 may include oxide. For example, the cover layer O1 may be formed using an ALD process. Referring to FIG. 22, through a planarization process, the upper surface of the mask pattern MP may be exposed, and upper surfaces of the first mask pattern MP1, the second mask pattern MP2 and the cover layer O1 may be coplanar. Subsequently, the mask pattern MP and the cover layer O1 may be removed through an etch-back process, similarly to FIG. 19, and the passive pattern PLb may be removed through an ashing process as in FIG. 20.

Figure 23:
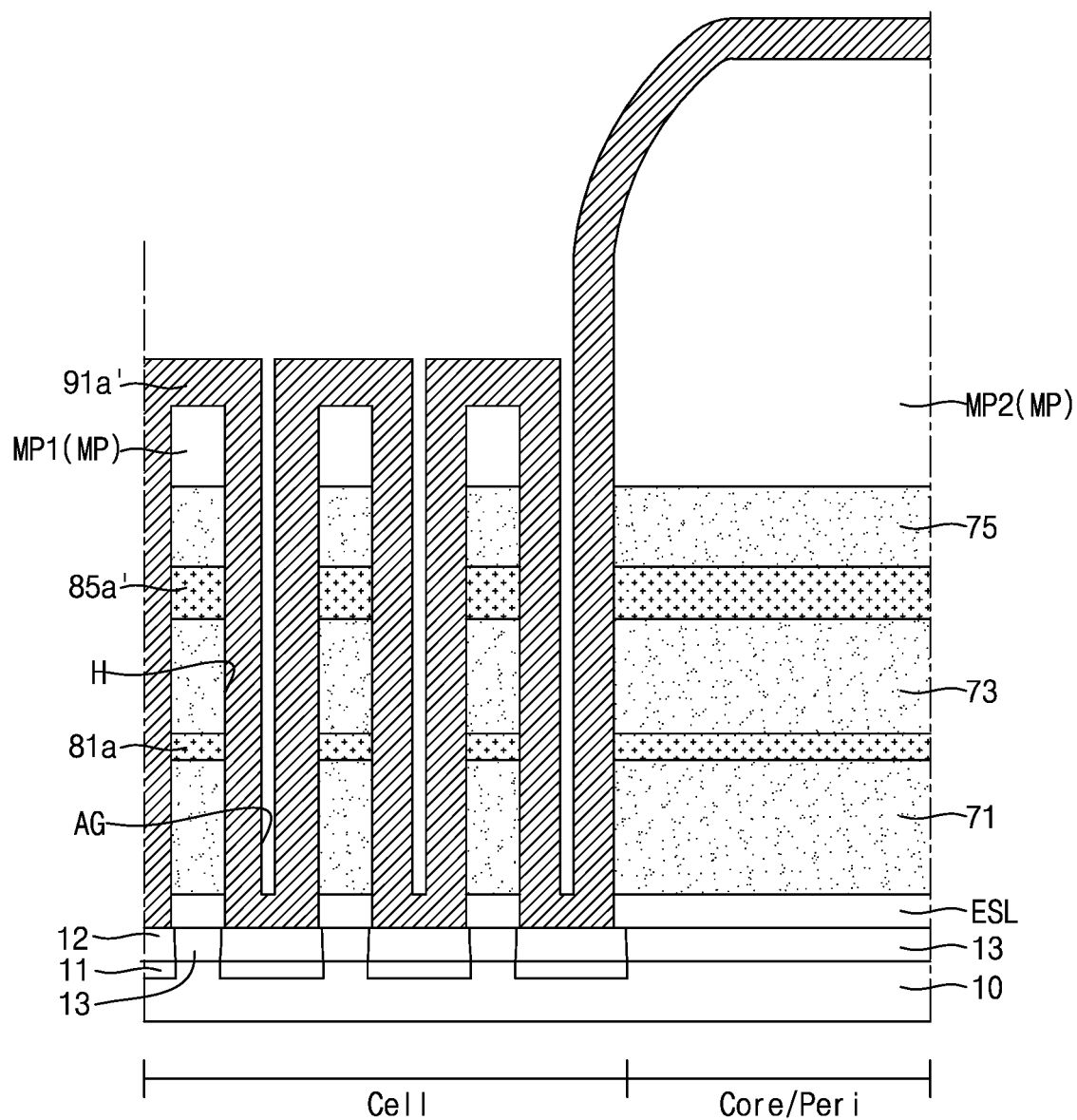
FIGS. 23 to 25 are cross-sectional views illustrating a method for forming a semiconductor device according to an embodiment of the present disclosure.
Figure 24:
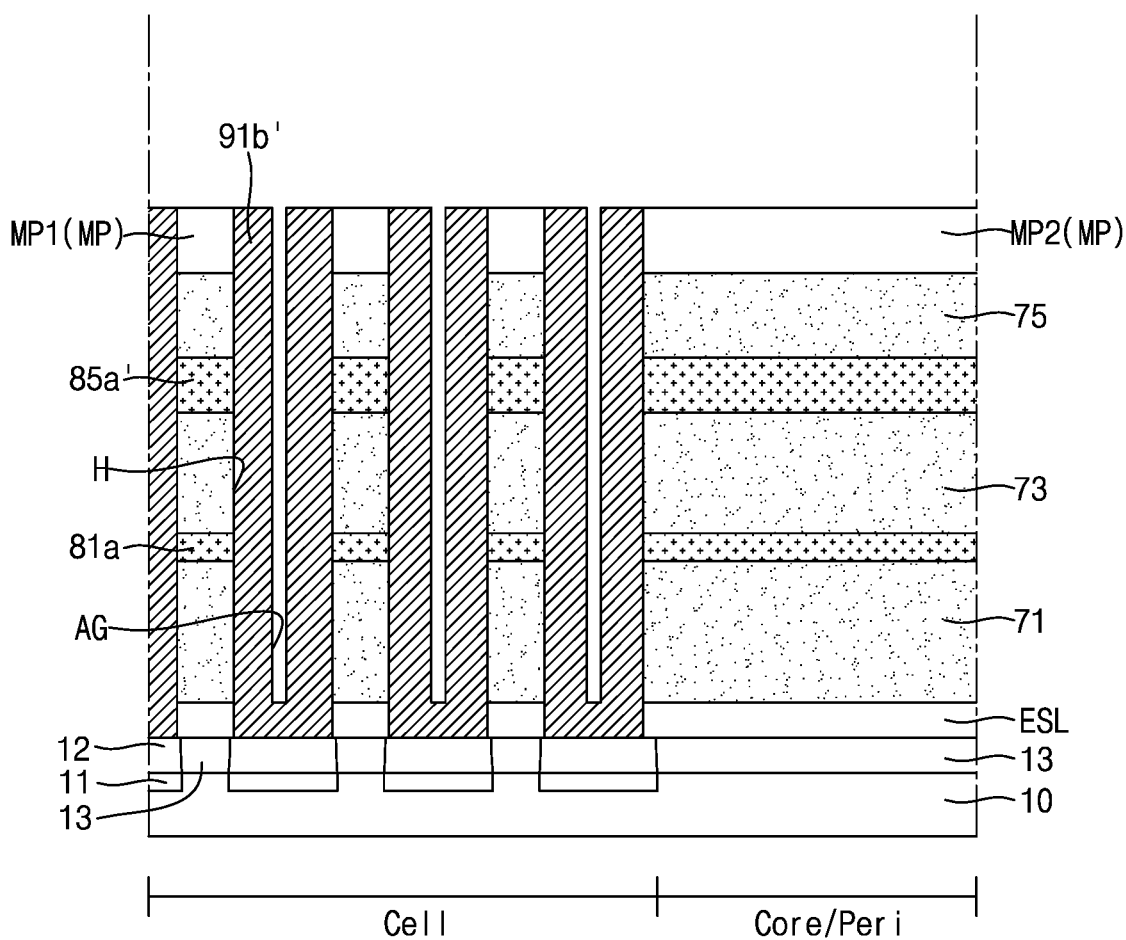
Figure 25:
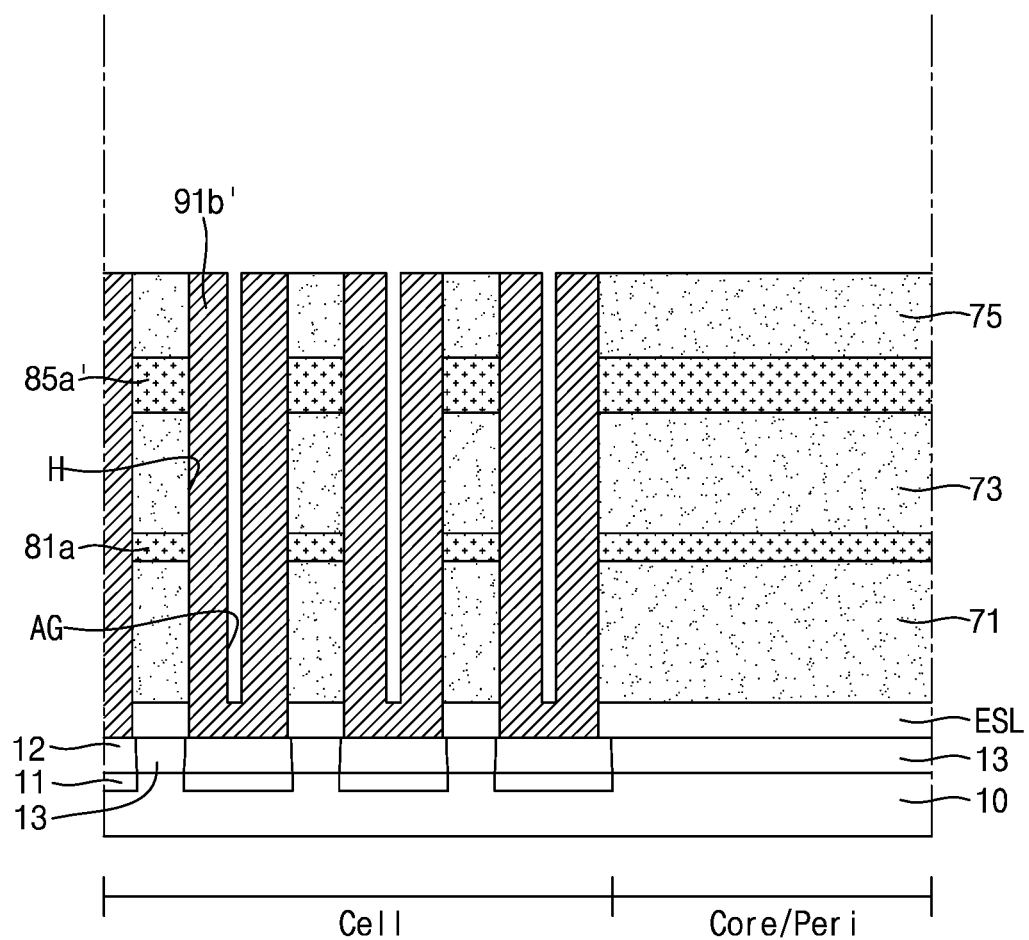

FIGS. 23 to 25 are cross-sectional views illustrating a method for forming a semiconductor device according to an embodiment of the present disclosure.

Referring to FIG. 23, the method may include formation of a mold structure on a substrate 10, formation of storage node electrode holes H, and formation of an electrode material layer 91a'.

The mold structure may include mold layers and supporter layers stacked in an alternating manner. The uppermost layer of the mold structure may be a mold layer. A mask pattern MP may be formed on the mold layer. Storage node electrode holes H may be formed through an anisotropic etching process using the mask pattern MP as an etch mask. As the mold structure is etched, a first mold layer 71, a preliminary lower supporter pattern 81a, a second mold layer 73, a preliminary upper supporter pattern 85a' and a third mold layer 75, which are sequentially stacked, may be formed.

An electrode material layer 91a' may at least partially cover an upper surface of the mask pattern MP while at least partially filling the storage node electrode holes H. The electrode material layer 91a' may include titanium nitride (TiN). The electrode material layer 91a' may be formed using a process such as CVD, PVD or ALD.

Referring to FIG. 24, the method may include formation of lower storage node electrodes 91b' through removal of the electrode material layer 91a' formed on the mask pattern MP and physical separation of the electrode material layer 91a' using a planarization process such as chemical mechanical planarization (CMP). In accordance with the planarization process, upper surfaces of the lower storage node electrodes 91b' may be coplanar with the upper surface of the remaining mask pattern MP. In addition, the upper surface of the first mask pattern MP1 in the cell area Cell and the upper surface of the second mask pattern MP2 in the core/peri area Core/Peri may be coplanar.

Referring to FIG. 25, the method may include removal of the mask pattern MP and the storage node electrodes 91b' through an etch-back process and wet cleaning through an ADM cleaning process. In accordance with removal of the mask pattern MP, an upper surface of the third mold layer 75 may be exposed.

In an embodiment, the method may further include formation of a top supporter layer on the lower storage node electrodes 91b' and the third mold layer 75. In an embodiment, formation of the top supporter layer may be performed after execution of the processes of FIGS. 11 to 14 and FIG. 1C or after execution of the processes of FIGS. 11 to 13, FIG. 15, FIG. 16 and FIG. 2A.

In order to increase the capacity of a capacitor, technology of increasing the height of a storage node electrode is used. Upon forming the electrode material layer 91a', it may be possible to increase the height of the storage node electrodes (the lower storage node electrodes 91b') using the height of the mask pattern MP. Using the passive layer PLa and the passive pattern PLb, it may be possible to eliminate an over-etching phenomenon (for example, insulation defect) in which insulating materials such as the mold layers are etched in etching processes. Using the passive layer PLa and the passive patterns PLb, it may also be possible to avoid loss of the storage node electrodes caused by production of by-products such as $TiF_x$ occurring during removal of the mask pattern MP.

Figure 31:
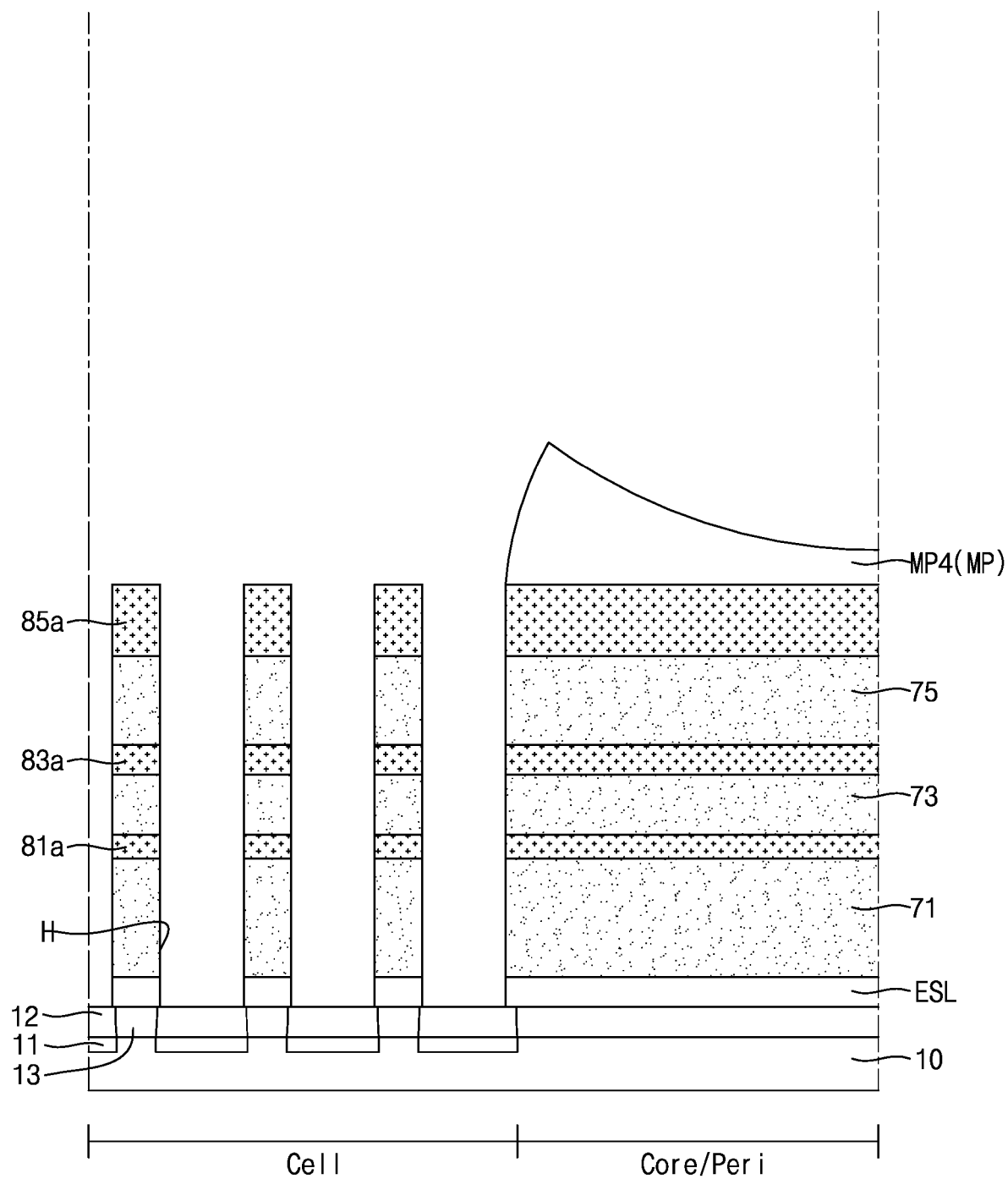
FIGS. 31 to 33 are cross-sectional views illustrating a method for forming a semiconductor device according to an embodiment of the present disclosure.
Figure 32:
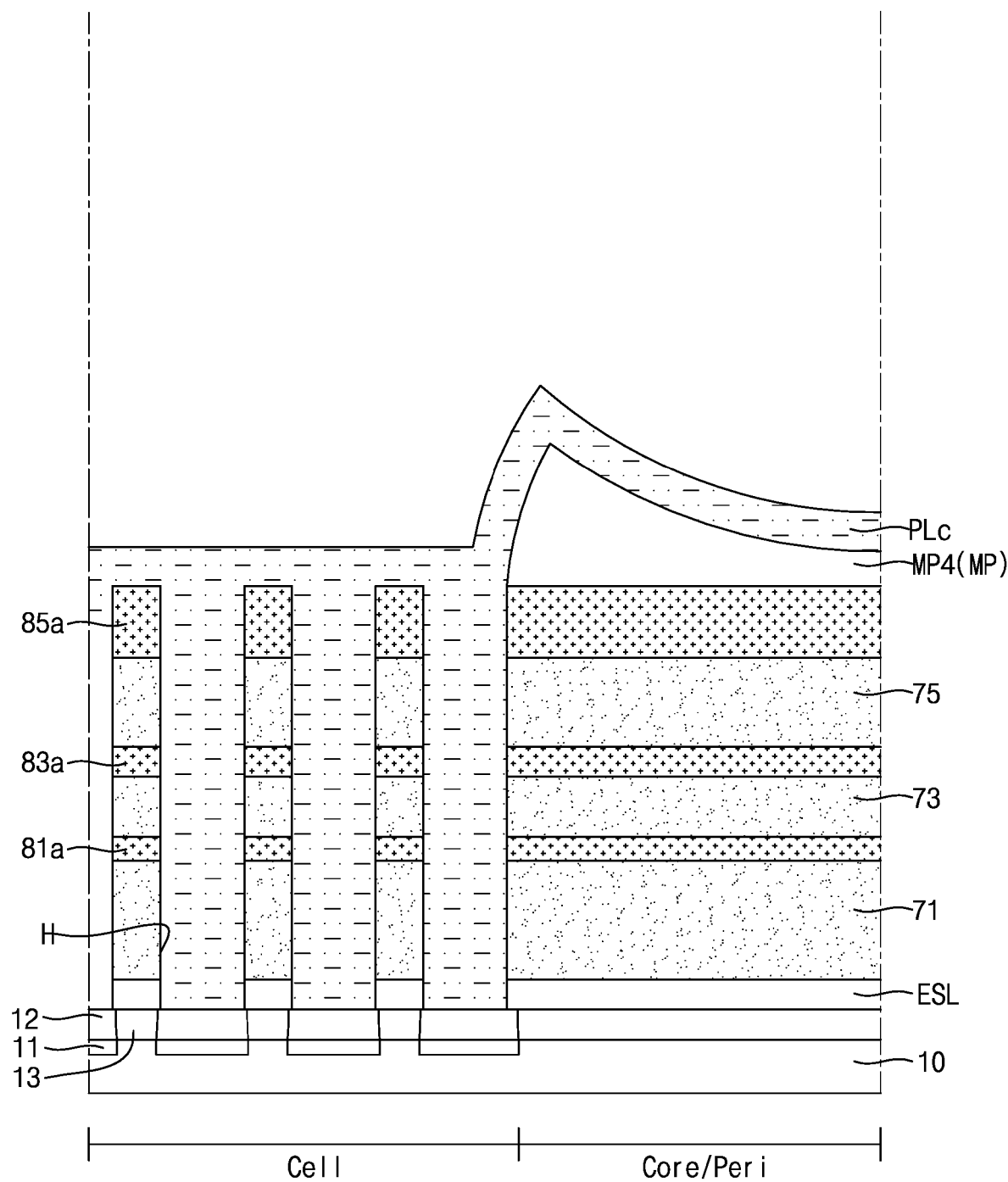
Figure 33:
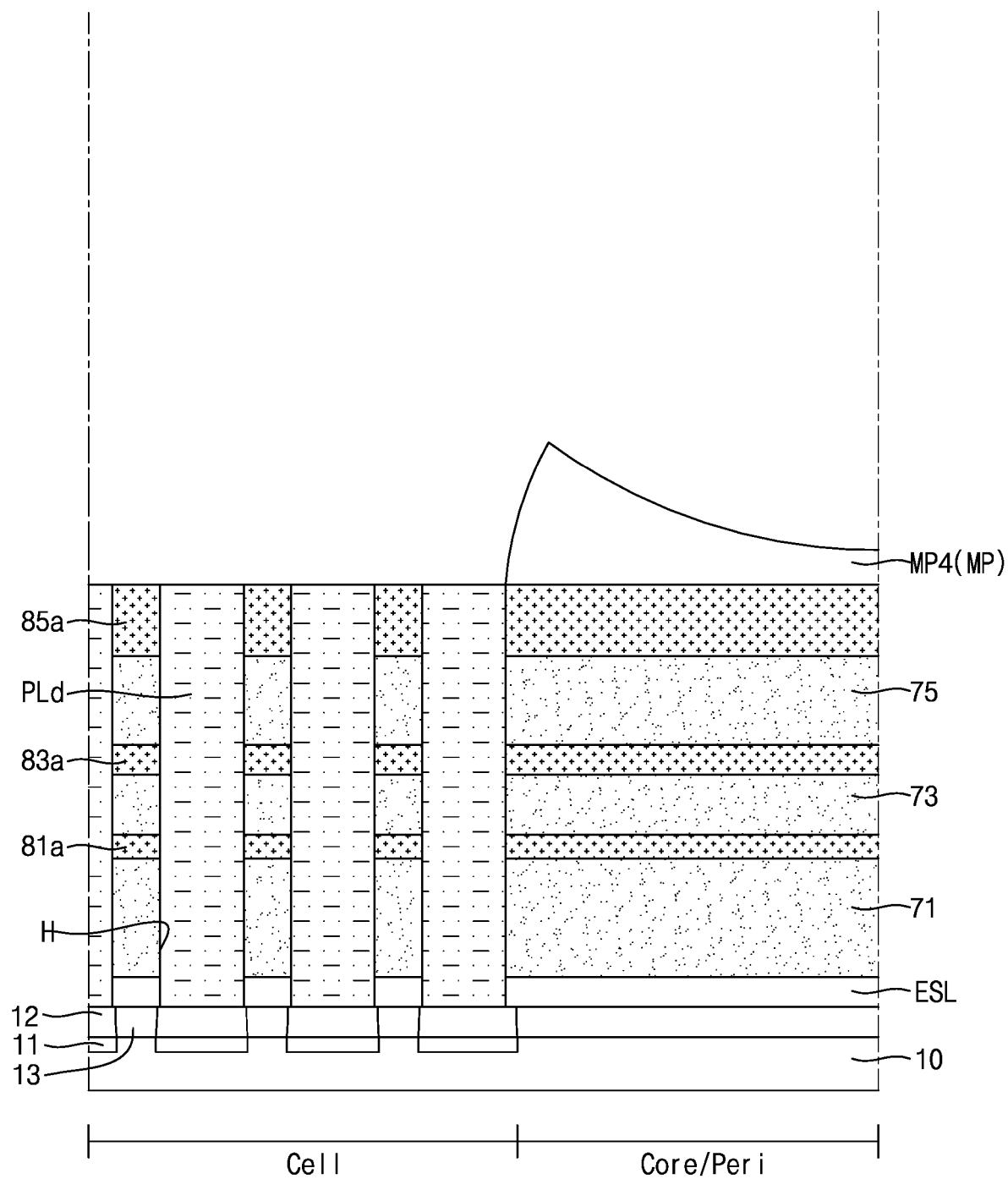

FIGS. 26 to 30 are cross-sectional views illustrating a method for forming a semiconductor device according to an embodiment of the present disclosure. FIGS. 31 to 33 are cross-sectional views illustrating a method for forming a semiconductor device according to an embodiment of the present disclosure. In the drawings, which will be explained hereinafter, constituent elements disposed beneath a capacitor structure are shown.

Figure 26:
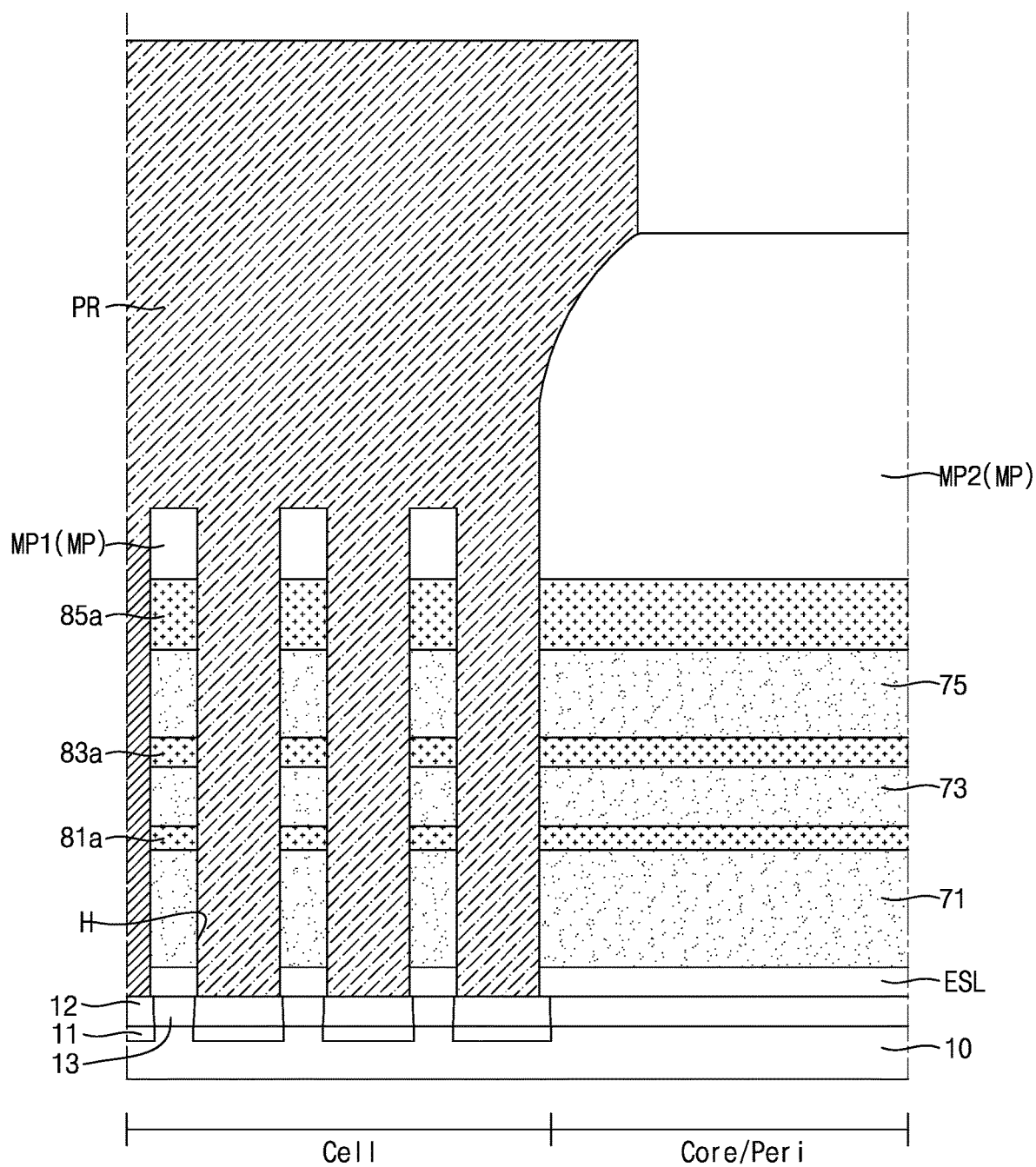
FIGS. 26 to 30 are cross-sectional views illustrating a method for forming a semiconductor device according to an embodiment of the present disclosure.

Referring to FIG. 26, the method may include formation of a mask pattern MP and formation of storage node electrode holes H, as in the processes explained with reference to FIGS. 3 and 4, and may further include formation of a photoresist pattern PR at least partially filling the storage node electrode holes H. In an embodiment, the mask pattern MP may be a silicon mask doped with impurities such as boron (B). The photoresist pattern PR is formed in a cell area Cell to completely cover a first mask pattern MP1. A portion of the photoresist pattern PR is formed in a core/peri area Core/Peri to at least partially cover a portion of the mask pattern MP in the core/peri area Core/Peri.

Figure 27:
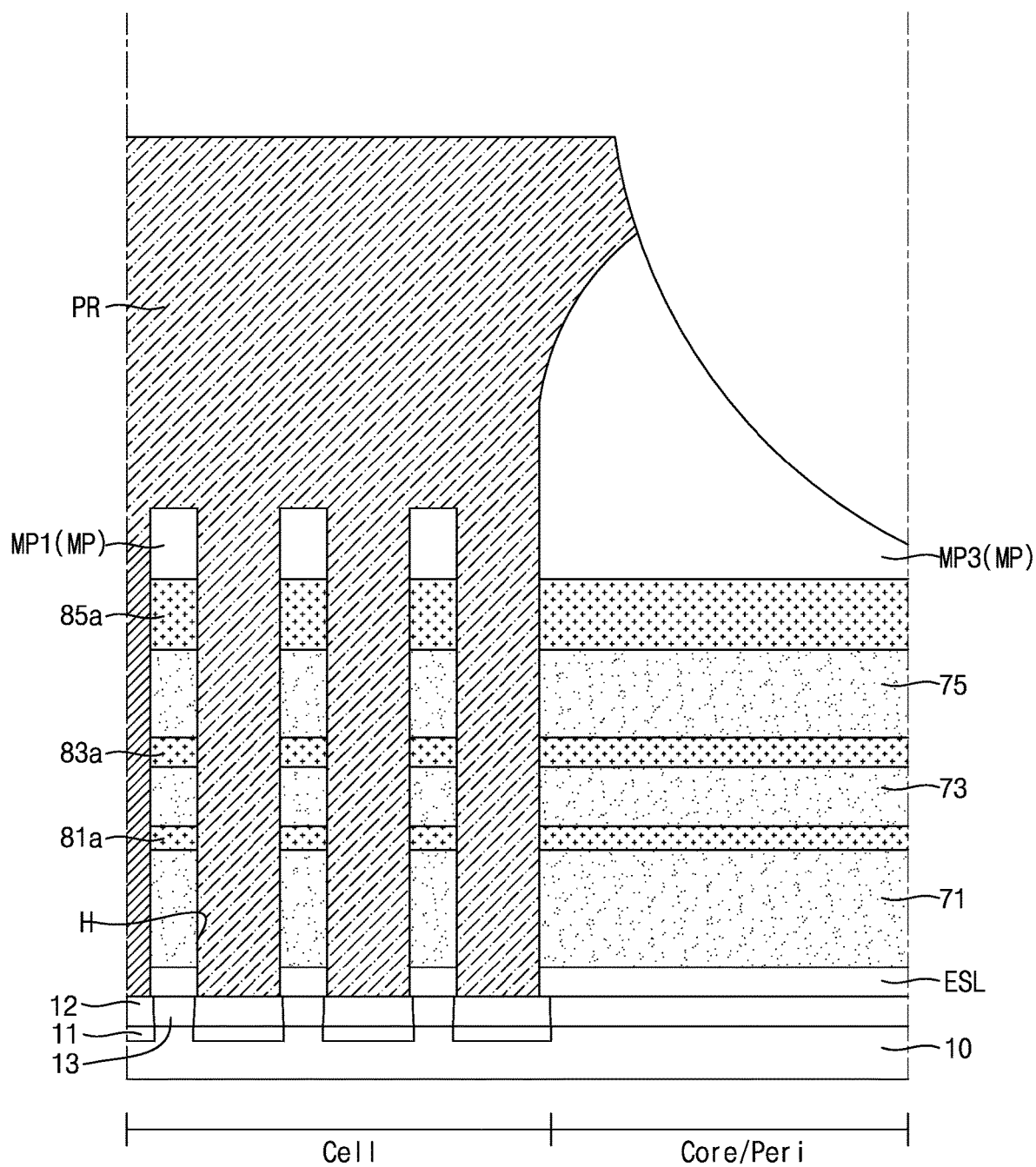

Referring to FIG. 27, the method may include formation of a third mask pattern MP3 through etch-back of a portion of the second mask pattern MP2 exposed at an upper surface thereof in the core/peri area Core/Peri. Through an etch-back process, the third mask pattern MP3 may have a relatively great thickness at a portion thereof disposed adjacent to the cell area Cell. The third mask pattern MP3 may have a portion having a thickness gradually decreasing as the portion extends away from the cell area Cell.

Figure 28:
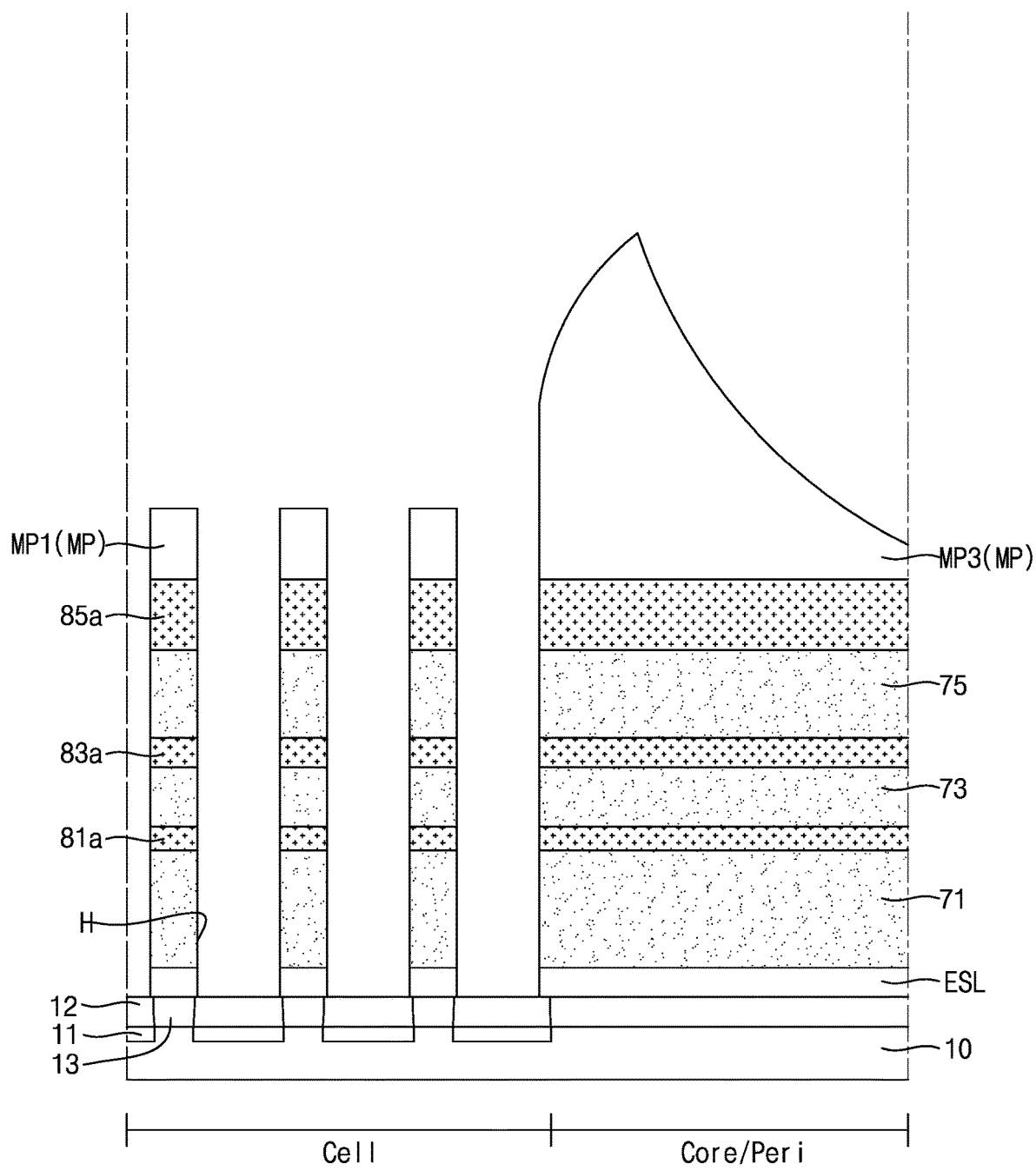

Referring to FIG. 28, the method may include removal of the photoresist pattern Pr. The photoresist pattern PR may be removed through an ashing process and/or a stripping process. In accordance with removal of the photoresist pattern PR, the storage node electrodes holes H may be opened, and an upper surface of a connection structure 12 may be exposed through the storage node electrode holes H.

Figure 29:
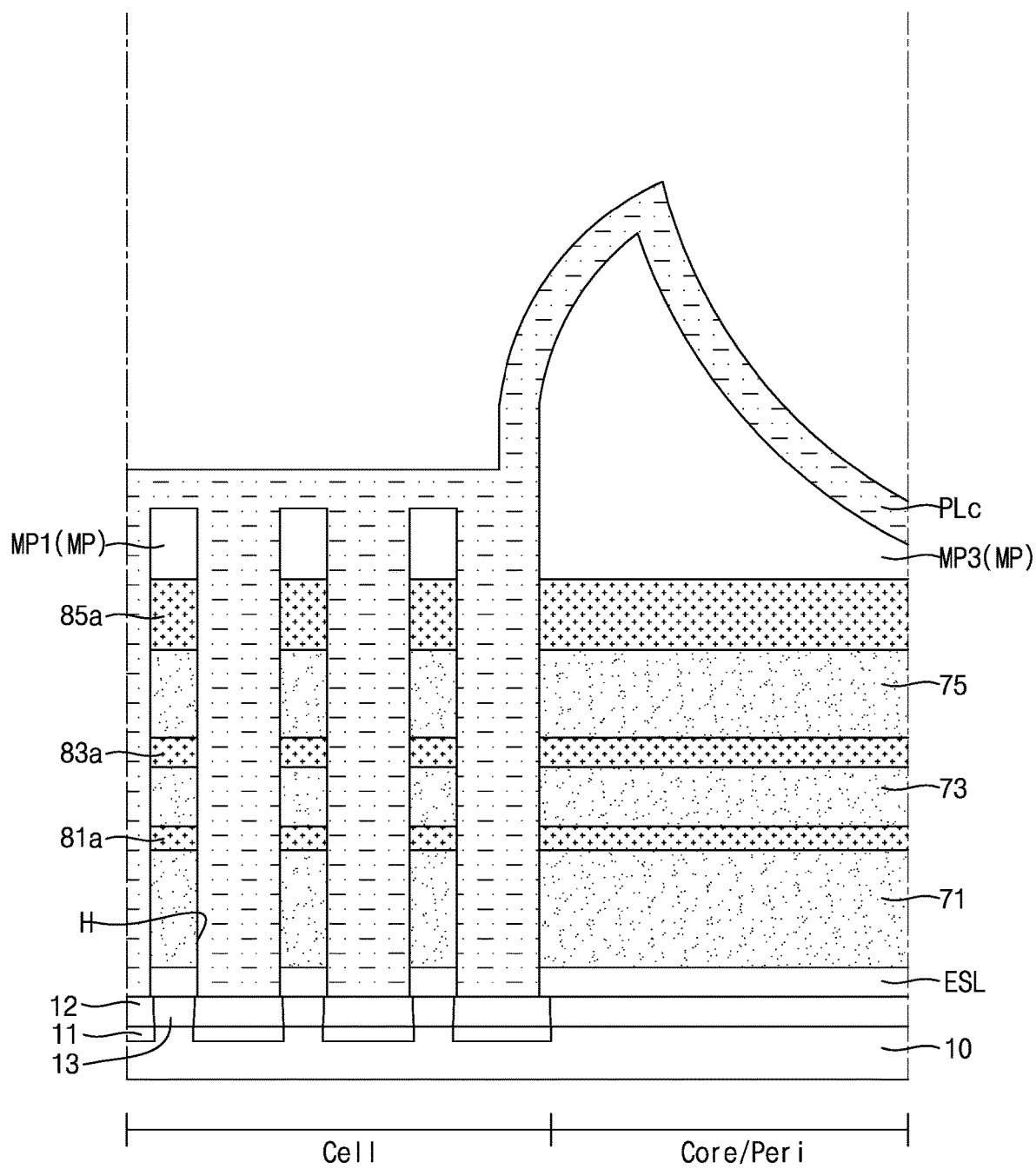

Referring to FIG. 29, the method may include formation of a passive layer PLc at least partially covering the mask pattern MP while at least partially filling the storage node electrode holes H. For example, the passive layer PLc may include at least one of titanium nitride (TiN), a spin-on hard mask, an amorphous carbon layer or tin oxide ($SnO_x$).

Figure 30:
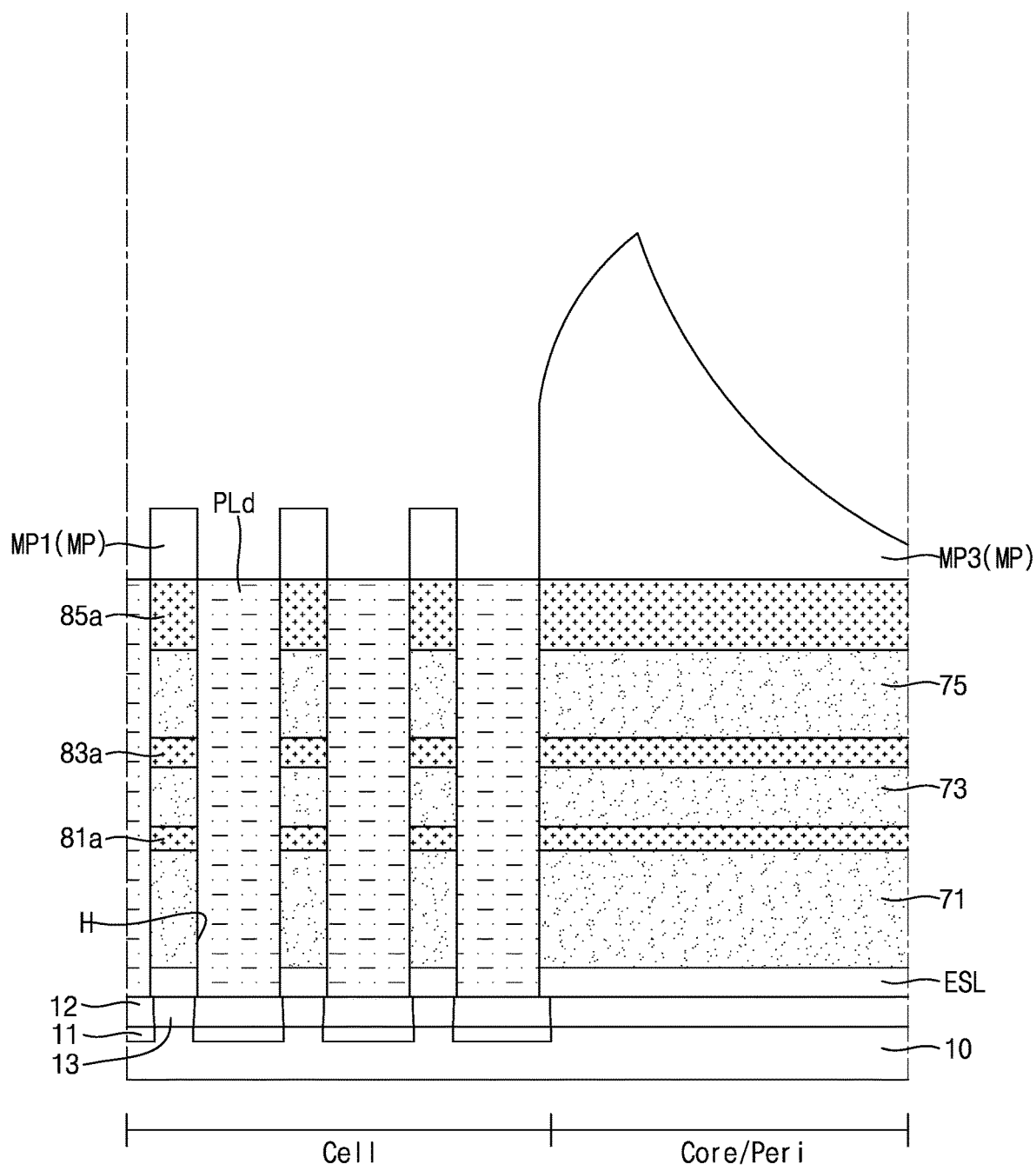

Referring to FIG. 30, the method may include formation of a passive pattern PLd and exposure of the mask pattern MP through removal of a portion of the passive layer PLc using a partial etch-back process. The method may further include subsequent removal of the mask pattern MP. For example, the mask pattern MP may be removed through a dry etching process. In accordance with removal of the mask pattern MP, an upper surface of a preliminary upper supporter pattern 85a may be exposed. The method may further include subsequent removal of the passive pattern PLd.

Referring to FIG. 31, the method may further include partial removal of the third mask pattern MP through an etch-back process after execution of the process of removing the photoresist pattern PR in FIG. 28. In accordance with removal of the first mask pattern MP1, the upper surface of the preliminary upper supporter pattern 85a may be exposed. As the second mask pattern MP3 is partially etched, a fourth mask pattern MP4 having a reduced height may be formed.

Referring to FIG. 32, the method may include formation of a passive layer PLc at least partially covering the fourth mask pattern MP4 while at least partially filling the storage node electrode holes H. The passive layer PLc may at least partially cover the upper surface of the preliminary upper supporter pattern 85a. Referring to FIG. 33, the method may include formation of a passive pattern PLd through partial removal of the passive layer PLc using an etch-back process. In accordance with a partial etch-back process, the upper surface of the preliminary upper supporter pattern 85a may be exposed, and the fourth mask pattern MP4 may be exposed. The method may further include removal of the fourth mask pattern MP4 and removal of the passive pattern PLd through a subsequent planarization process.

In accordance with the methods described above with reference to FIGS. 26 to 33, the mask pattern MP is previously partially removed through an etch-back process and, as such, an over-etching phenomenon (for example, insulation defect) in which insulating materials such as the mold layers are etched in etching processes may be eliminated. Using the passive layer PLa and the passive patterns PLb, it may also be possible to avoid loss of the storage node electrodes caused by production of by-products such as $TiF_x$ occurring during removal of the mask pattern MP.

As apparent from the above description, in accordance with embodiments of the present disclosure, a leakage problem of a capacitor may be eliminated through formation of a filler at a storage node electrode. A bridge disturb (BD) margin between the storage node electrodes may also be secured and, as such, a bridge phenomenon may be avoided.

Although the preferred embodiments of the present disclosure have been disclosed for illustrative purposes, those skilled in the art will appreciate that various modifications, additions and substitutions are possible, without departing from the scope and spirit of the disclosure.

What is claimed is:

1. A semiconductor device, comprising:
a substrate;
a storage node electrode disposed on the substrate;
a dielectric layer at least partially covering the storage node electrode; and
a plate electrode disposed on the dielectric layer,
wherein the storage node electrode has a pillar shape, and comprises a seam and a concave first side surface that is disposed at a higher level than the seam.

2. The semiconductor device according to claim 1, further comprising:
a supporter pattern disposed on a second side surface of the storage node electrode.

3. The semiconductor device according to claim 2, wherein:
the supporter pattern comprises:
an upper supporter pattern comprising a convex round side surface, and
a lower supporter pattern disposed at a lower level than the upper supporter pattern; and
the round side surface of the upper supporter pattern contacts the concave first side surface of the storage node electrode.

4. The semiconductor device according to claim 3, wherein an upper end of the upper supporter pattern is disposed at a higher level than an upper end of the storage node electrode.

5. The semiconductor device according to claim 3, wherein the upper supporter pattern comprises an overhang vertically overlapping with the storage node electrode.

6. The semiconductor device according to claim 1, wherein the seam comprises a filler, and an air gap disposed beneath the filler.

7. The semiconductor device according to claim 6, wherein the filler comprises SiCN and/or SiBN.

8. A semiconductor device, comprising:
a substrate;
a storage node electrode disposed on the substrate;
a dielectric layer at least partially covering the storage node electrode;
a plate electrode disposed on the dielectric layer; and
a supporter pattern disposed on a side surface of the storage node electrode,
wherein the supporter pattern comprises:
a lower supporter pattern disposed on the substrate, and
an upper supporter pattern disposed on the lower supporter pattern, the upper supporter pattern having a convex side surface,
wherein the storage node electrode comprises a concave side surface disposed at an upper portion thereof, and
wherein the concave side surface of the storage node electrode contacts the convex side surface of the upper supporter pattern.

9. The semiconductor device according to claim 8, wherein the storage node electrode has a pillar shape, and further comprises a seam comprising a filler disposed therein.

10. The semiconductor device according to claim 9, wherein the seam further comprises an air gap disposed beneath the filler.

11. The semiconductor device according to claim 8, wherein:
the dielectric layer comprises lower dielectric layers contacting a lower surface of the upper supporter pattern; and
the storage node electrode comprises a protrusion vertically overlapping with the lower dielectric layers.

12. The semiconductor device according to claim 11, wherein the protrusion comprises:
a lower protrusion interposed between the lower dielectric layers and contacting the lower supporter pattern; and
an upper protrusion interposed between the upper supporter pattern and one of the lower dielectric layers.

13. The semiconductor device according to claim 8, wherein the storage node electrode comprises:
a first side surface having a concave or convex profile; and
a second side surface completely covered by the dielectric layer, the second side surface having a flat profile.

14. The semiconductor device according to claim 8, wherein the supporter pattern comprises SiCN and/or SiBN.

15. The semiconductor device according to claim 8, wherein the supporter pattern further comprises an intermediate supporter pattern disposed between the upper supporter pattern and the lower supporter pattern.

16. A method for manufacturing a semiconductor device, comprising:
forming an element isolation layer in a substrate to define a source and/or drain region;
forming, in the substrate, a word line extending primarily in a first direction across the source and/or drain region;
forming a bit line contact plug on the source and/or drain region;

forming, on the bit line contact plug, a bit line extending primarily in a second direction that is different from the first direction;

forming a storage node contact on the source and/or drain region;

forming a landing pad on the storage node contact;

forming a storage node electrode on the landing pad;

forming a dielectric layer at least partially surrounding a surface of the storage node electrode;

forming a plate electrode on the dielectric layer; and forming a supporter pattern contacting a side surface of the storage node electrode, wherein the storage node electrode has a pillar shape and includes a seam disposed therein, and the storage node electrode has a concave side surface at an upper portion thereof, and wherein the supporter pattern comprises an overhang contacting the side surface of the upper portion of the storage node electrode while vertically overlapping the storage node electrode.

17. The method according to claim 16, wherein formation of the overhang of the supporter pattern comprises:

forming a storage node electrode hole exposing the landing pad;

forming a lower storage node electrode comprising an air gap disposed in the storage node electrode hole;

forming a capping layer at least partially covering a surface of the supporter pattern and an upper surface of the lower storage node electrode and filling at least a portion of the air gap; and partially removing the capping layer, thereby forming a supporter capping layer on the supporter pattern.

18. The method according to claim 16, wherein the forming the storage node electrode comprises:

forming a storage node electrode hole;

forming a lower storage node electrode comprising an air gap;

forming a filler in the air gap, thereby forming the seam; and forming an upper storage node electrode contacting the filler, the lower storage node electrode and the supporter pattern.

19. The method according to claim 16, wherein:

the storage node electrode further comprises a protrusion contacting the supporter pattern at a side surface thereof; and formation of the protrusion comprises:

forming an opening at the supporter pattern, forming a cavity exposing a portion of a side surface of the storage node electrode and a lower surface of the supporter pattern, and recessing the portion of the side surface of the storage node electrode exposed to the cavity.

20. The method according to claim 16, further comprising:

before forming the storage node electrode, alternately stacking mold layers and supporter layers on the substrate, thereby forming a mold structure comprising an uppermost support layer;

forming a mask pattern on the mold structure;

partially etching the mold structure, thereby forming a storage node electrode hole exposing the landing pad;

forming a passive pattern at least partially filling the storage node electrode hole;

removing the mask pattern; and removing the passive pattern, thereby opening the storage node electrode hole, wherein the passive pattern comprises a silicon oxide comprising carbon, an amorphous carbon layer, a tin oxide, and/or a titanium nitride, and wherein the removing the mask pattern comprises performing a radical dry cleaning process or an etch-back process and an ammonium hydroxide DIW mixture (ADM) cleaning process.

* * * * *